United States Patent
Yamamoto et al.

(10) Patent No.: US 10,141,388 B2
(45) Date of Patent: **\*Nov. 27, 2018**

(54) DISPLAY DEVICE WITH TRANSISTOR SAMPLING FOR IMPROVED PERFORMANCE

(71) Applicant: Sony Corporation, Tokyo (JP)

(72) Inventors: Tetsuro Yamamoto, Kanagawa (JP); Katsuhide Uchino, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/897,314

(22) Filed: Feb. 15, 2018

(65) Prior Publication Data

US 2018/0190746 A1 Jul. 5, 2018

Related U.S. Application Data

(63) Continuation of application No. 15/489,085, filed on Apr. 17, 2017, now Pat. No. 9,923,041, which is a (Continued)

(30) Foreign Application Priority Data

May 13, 2008 (JP) .................. 2008-126118

(51) Int. Cl.
| | |
|---|---|
| G09G 3/30 | (2006.01) |
| H01L 27/32 | (2006.01) |
| G09G 3/3233 | (2016.01) |
| H05B 33/08 | (2006.01) |

(Continued)

(52) U.S. Cl.
CPC .......... *H01L 27/3265* (2013.01); *C22C 38/22* (2013.01); *G09G 3/3233* (2013.01); *H01L 23/53214* (2013.01); *H01L 27/3248* (2013.01); *H01L 27/3276* (2013.01); *H01L 51/5203* (2013.01); *H05B 33/08* (2013.01);
(Continued)

(58) Field of Classification Search
CPC .......... G09G 3/30; G09G 3/32; G09G 3/3208; G09G 3/3233; G09G 2300/0426; G09G 2300/0465; G09G 2300/0819; G09G 2300/0866
See application file for complete search history.

(56) References Cited

U.S. PATENT DOCUMENTS

| | | |
|---|---|---|
| 7,164,399 B2 | 1/2007 | Matsumoto et al. |
| 8,390,540 B2 | 3/2013 | Yamamoto et al. |

(Continued)

FOREIGN PATENT DOCUMENTS

| | | |
|---|---|---|
| JP | 10-198292 | 7/1998 |
| JP | 2003-045966 | 2/2003 |

(Continued)

*Primary Examiner* — Vijay Shankar
(74) *Attorney, Agent, or Firm* — Dentons US LLP

(57) ABSTRACT

A display device including a pixel array having a plurality of pixels arranged in a matrix form, each of the pixels including a sampling transistor configured to sample a data potential from a video signal line which is insulated from and intersects a control line in response to the change in potential of the control line, and a light-emitting element configured to emit light at the brightness commensurate with the magnitude of the post-sampling data potential.

1 Claim, 13 Drawing Sheets

Related U.S. Application Data continuation of application No. 15/225,119, filed on Aug. 1, 2016, now Pat. No. 9,685,491, which is a continuation of application No. 14/826,810, filed on Aug. 14, 2015, now Pat. No. 9,437,662, which is a continuation of application No. 14/557,917, filed on Dec. 2, 2014, now Pat. No. 9,142,604, which is a continuation of application No. 13/742,525, filed on Jan. 16, 2013, now Pat. No. 8,941,564, which is a continuation of application No. 12/464,534, filed on May 12, 2009, now Pat. No. 8,390,540.

(51) Int. Cl.
 *C22C 38/22* (2006.01)
 *H01L 23/532* (2006.01)
 *H01L 51/52* (2006.01)

(52) U.S. Cl.
 CPC ............ *G09G 2300/0426* (2013.01); *G09G 2300/0465* (2013.01); *G09G 2300/0819* (2013.01); *G09G 2300/0842* (2013.01); *G09G 2300/0866* (2013.01); *G09G 2320/0223* (2013.01)

(56) References Cited

U.S. PATENT DOCUMENTS

| | | | |
|---|---|---|---|
| 8,941,564 | B2 | 1/2015 | Yamamoto et al. |
| 9,082,345 | B2 | 7/2015 | Yamamoto et al. |
| 9,142,604 | B2 | 9/2015 | Yamamoto et al. |
| 9,437,662 | B2 | 9/2016 | Yamamoto |
| 9,685,491 | B2 * | 6/2017 | Yamamoto ............ G09G 3/3233 |
| 9,923,041 | B2 * | 3/2018 | Yamamoto .......... H01L 27/3265 |
| 2009/0295773 | A1 | 12/2009 | Taneda et al. |
| 2010/0177126 | A1 | 7/2010 | Inoue et al. |
| 2011/0074838 | A1 | 3/2011 | Yamamoto et al. |
| 2016/0343790 | A1 | 11/2016 | Yamamoto et al. |

FOREIGN PATENT DOCUMENTS

| | | |
|---|---|---|
| JP | 2003-108036 | 4/2003 |
| JP | 2004-004192 | 1/2004 |
| JP | 2004-317916 | 11/2004 |
| JP | 2007-226184 | 9/2007 |
| JP | 2007-235145 | 9/2007 |

* cited by examiner

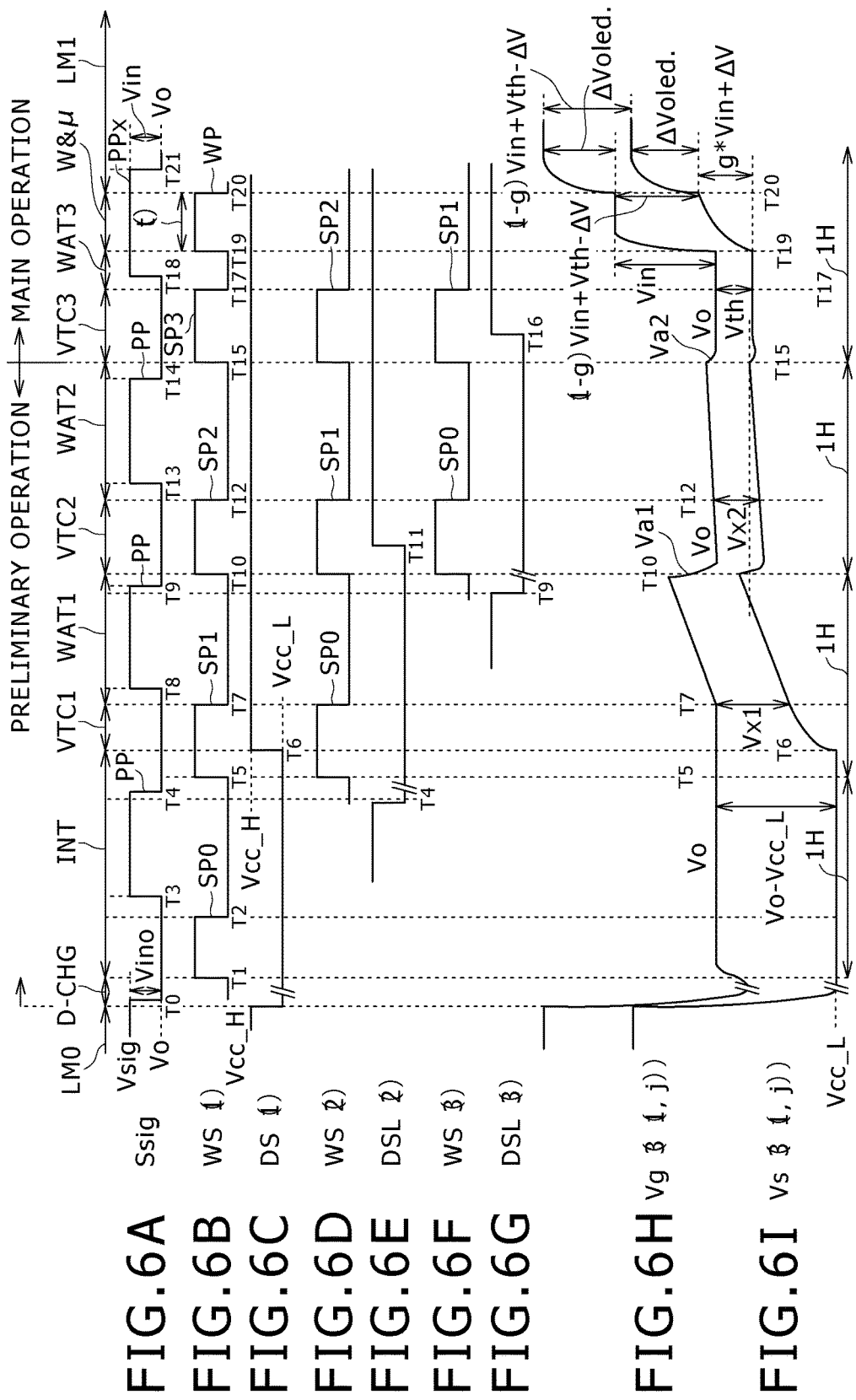

DISPLAY DEVICE WITH TRANSISTOR SAMPLING FOR IMPROVED PERFORMANCE

RELATED APPLICATION DATA

This application is a continuation of U.S. patent application Ser. No. 15/489,085 filed Apr. 17, 2017, which is a continuation of U.S. patent application Ser. No. 15/225,119 filed Aug. 1, 2016, now U.S. Pat. No. 9,685,491 issued Jun. 20, 2017, which is a continuation of U.S. patent application Ser. No. 14/826,810 filed Aug. 14, 2015, now U.S. Pat. No. 9,437,662 issued Sep. 6, 2016, which is a continuation of U.S. patent application Ser. No. 14/557917 filed Dec. 2, 2014, now U.S. Pat. No. 9,142,604 issued Sep. 22, 2015, which is a continuation of U.S. patent application Ser. No. 13/742,525 filed Jan. 16, 2013, now U.S. Pat. No. 8,941,564 issued on Jan. 27, 2015 which is a continuation of U.S. patent application Ser. No. 12/464,534 filed May 12, 2009, now U.S. Patent No. 8,390,540 issued Mar. 5, 2013, the entireties of which are incorporated herein by reference to the extent permitted by law. The present application also claims priority to Japanese Priority Patent Application No. JP2008-126118 filed May 13, 2008, the entirety of which is incorporated by reference herein to the extent permitted by law.

BACKGROUND OF THE INVENTION

1. Field of the Invention

The present invention relates to a display device which includes a pixel array having a plurality of pixels arranged in a matrix form and wirings, common to the plurality of pixels and disposed in two directions, intersecting with each other in the pixels. More specifically, the present invention relates to a wiring forming technique for minimizing the number of wirings disposed in the two directions and bringing the resistances thereof close to each other to the extent possible.

2. Description of the Related Art

Some display devices use electro-optical elements whose brightness changes with change in voltage applied thereto or current flowing therethrough. For example, a liquid crystal display element is a typical example of an electro-optical element whose brightness changes with change in voltage applied thereto. A display device using such elements is called a "liquid crystal display device."

On the other hand, an organic electro-luminescence element is a typical example of an electro-optical element whose brightness changes with change in current flowing therethrough. An organic electro-luminescence element is commonly called an OLED (Organic Light Emitting Diode). A liquid crystal display element is an optical modulation element (i.e., non-self-luminous) adapted to modulate light from the light source. An OLED differs from a liquid crystal display element in that the former is a self-luminous element which can emit light by itself. A display device using OLEDs will be herein referred to as an "organic EL display device."

Such liquid crystal display devices have become increasingly large in screen size, high in definition and low in cost, finding widespread use on a full-scale basis ahead of a complete transfer to digital broadcasting. As a result, these display devices are demanded to be further reduced in cost.

On the other hand, organic EL display devices offer many advantages over their liquid crystal counterparts, including no need for backlight, lower power consumption and possible reduction in thickness, and excellent moving image display performance. As a result, these devices are seen as a next-generation of display devices. Development efforts are moving at an accelerated pace to replace some of the liquid crystal display devices with organic EL ones with an eye toward widespread use of liquid crystal display devices on a full-scale basis.

In the development efforts for display devices typified by liquid crystal and organic EL display devices, it is essential that the manufacturing process be as simple as possible to prevent point and line defects for enhanced yield in order to provide a larger screen size. In particular, the empirical rule says that the fewer the lithography process steps adapted to perform patterning using resist, an organic material, the significantly less likely that defects will occur. Based on this rule, the wiring process is undergoing simplification (refer, for example, to a wiring structure having one aluminum layer described in Japanese Patent Laid-Open No. 2004-4192 and Japanese Patent Laid-Open No. 2004-317916 (hereinafter referred to as Patent Documents 1 and 2 regarding organic EL display device).

Both of the techniques disclosed in Patent Documents 1 and 2 offer a simpler wiring structure in the pixel using chromium layer and its overlying layer. The chromium layer is at the same hierarchical level and made of the same material as the gate electrode of the thin film transistor (TFT). The overlying layer is made of aluminum.

SUMMARY OF THE INVENTION

In the wiring structure described in Patent Document 1, no contacts are provided midway along the control lines for the sampling transistors and holding capacitors or along the video single lines and source voltage supply lines. The control lines are disposed in the row direction in the pixel (horizontally on the display screen). The video single lines and source voltage supply lines are disposed in the column direction (vertically on the display screen).

This prevents reduction in potential resulting from the contact resistance.

In the wiring structure described in Patent Document 1, however, all the control lines in the row direction are formed with a chromium layer, i.e., the gate metal. As a result, a large screen leads to a large signal delay in the control lines running in the row direction, readily resulting in a deviation in sampling timing particularly between pixels in the same row close to and far from the vertical drive circuit adapted to control the control lines. A large deviation in sampling timing gives rise to degraded display quality due to sampling of the video signal at a wrong level unless corrected, for example, by securing a large margin for variation of the video signal. On the other hand, the increased margin inhibits high-speed display. In both cases, therefore, the wiring structure described in Patent Document 1 is disadvantageous in that it is difficult to achieve larger screen size and higher definition.

The wiring structure described in Patent Document 2 has the same disadvantage as that described in Patent Document 1 because all the control lines in the row direction are formed with a chromium layer, i.e., the gate metal.

Further, in the wiring structure described in Patent Document 2, the signal line and power source supply line in the column direction are adjacent to each other between the adjacent pixels. Moreover, the two lines are formed with an aluminum layer at the same hierarchical level. Therefore, part of one of the two wirings adjacent to each other in the column direction has a lower bridge structure made of the same chromium layer, i.e., the gate metal, so as to reduce the probability of short circuit between the adjacent wirings due to inclusion of foreign objects. It should be noted, however, that because the wirings in the row direction are formed with the same chromium layer, the intersections between the wirings in the row and column directions cannot have this lower bridge structure. Therefore, the wiring structure described in Patent Document 2 is only limitedly effective in preventing short circuit between adjacent wirings.

Still further, the wiring structure described in Patent Document 2 has other disadvantage in addition to the signal delay in the wirings in the row direction. That is, the wirings in the column direction are alternately made of aluminum and chromium layers, and the two wirings are connected by a single contact hole. This leads to not only increased resistance but also signal delay due to contact connection resistance in the wirings in the column direction. If the video signals in the column direction have a large delay when there is already a rather large delay in the control signals in the row direction, it will be increasingly difficult to design the sampling timings properly, thus making it even more difficult to achieve larger screen size and higher definition.

A possible comprehensive solution to all the disadvantages of the background technology described above would be to provide an additional aluminum layer. However, this leads to increased manufacturing cost, making this solution unpractical.

It should be noted that other types of display devices such as liquid crystal display device have the same problems (difficulties in achieving larger screen size and higher definition) although no specific patent publication numbers are given. However, the proper video signal sampling timings are more essential for an organic EL display device than any other type of display device. Therefore, these difficulties are a more serious problem for organic EL display devices.

A display device according to an embodiment (first embodiment) of the present invention relates to a display device such as so-called organic EL display device having light-emitting elements. That is, the display device according to this embodiment includes a pixel array having a plurality of pixels arranged in a matrix form. Each of the plurality of pixels includes a sampling transistor and light-emitting element. The sampling transistor samples a data potential from a video signal line which is insulated from and intersects a control line in response to the change in potential of the control line. The light-emitting element emits light at the brightness commensurate with the magnitude of the post-sampling data potential.

Further, in the above display device, one of the video signal line and control line includes a high-fusion-point metal wiring layer and overlying wiring layer. The high-fusion-point metal wiring layer is made of the same material as the gate of the sampling transistor. The overlying wiring layer is connected to the high-fusion-point metal wiring layer via a contact hole. The other of the video signal line and control line is a single layer wiring provided at the same hierarchical level and made of the same material as the overlying wiring layer which intersects the one of the video signal line and control line at a portion of the layer which includes the high-fusion-point metal wiring layer. In the one of the video signal line and control line, the plurality of contact holes are provided for each wiring connection section adapted to connect an end portion of the layer including the high-fusion-point metal wiring and an end portion of the overlying wiring layer.

A display device according to another embodiment (second embodiment) of the present invention has the following feature in addition to the features according to the first embodiment. That is, the layer including the high-fusion-point metal wiring contains a metallic material having a higher wiring resistance and higher fusion point than the overlying wiring layer.

A display device according to still another embodiment (third embodiment) of the present invention has the following feature in addition to the features according to the first embodiment. That is, when the number of the contact holes is increased for each of the wiring connection sections, only a given number of the contact holes are provided if a signal waveform of the video signal line no longer shows any change of response with the given number of the contact holes or more provided.

A display device according to still another embodiment (fourth embodiment) of the present invention has the following feature in addition to the features according to the first embodiment. That is, a source voltage supply line adapted to pass a drive current through the light-emitting element is disposed in the pixel in parallel with the control line. The intersection between the source voltage supply line and video signal line is formed with other high-fusion-point metal wiring layer provided at the same hierarchical level and made of the same material as the layer including the high-fusion-point metal wiring. As many contact holes as in the wiring connection section are formed in other wiring connection section between the other layer including the high-fusion-point metal wiring and the overlying wiring layer.

Further preferably, the layer including the high-fusion-point metal wiring and the other layer including the high-fusion-point metal wiring are connected so as to form a single pattern (fifth embodiment).

Further preferably, the overlying wiring layer is disposed so as to form a length while at the same time providing a predetermined spacing with the control line and source voltage supply line respectively to prevent short circuit. The contact holes shared by the wiring connection section and other wiring connection section are arranged along the length of the overlying wiring layer (sixth embodiment). Further preferably, as many of the contact holes as possible are arranged over the entire length thereof.

A display device according to still another embodiment (seventh embodiment) of the present invention has the following feature in addition to the features according to the first embodiment. That is, the number of the contact holes of the wiring connection section is larger than the maximum number of contact holes provided for each of the other connection sections in the pixel, including the connection section adapted to connect the control line to the control node of the sampling transistor.

A display device according to still another embodiment (eighth embodiment) of the present invention includes a pixel array having a plurality of pixels arranged in a matrix form. First and second wirings are provided at least one each for each of the plurality of pixels. The first wiring is disposed in one direction. The second wiring is disposed in a direction orthogonal to the first wiring. One of the first and second wirings is formed with a high-fusion-point metal wiring layer, contact hole and overlying wiring layer. The contact hole is provided in an insulating layer on the high-fusion-point metal wiring layer. The overlying wiring layer is connected to the high-fusion-point metal wiring layer via the contact hole and provided on the insulating layer. The other of the first and second wirings is a single layer wiring provided at the same hierarchical level and made of the same material as the overlying wiring layer. The plurality of contact holes are provided for each wiring connection section adapted to connect an end portion of the layer including the high-fusion-point metal wiring and an end portion of the overlying wiring layer.

Further preferably, the layer including the high-fusion-point metal wiring contains a metallic material having a higher wiring resistance and higher fusion point than the overlying wiring layer (ninth embodiment).

The display devices according to the above-described first to seventh embodiments will be described below. In this description, we assume, as an example, that the video signal line has a two-layered wiring structure in which the layer including the high-fusion-point metal wiring and the overlying wiring layer are connected by a plurality of contacts, that the control line (and source voltage supply line) are each a single layer wiring provided at the same hierarchical level and made of the same material as the overlying wiring layer, and that the control line (and source voltage supply line) are disposed in a direction different from that of the video signal line. The present invention also includes the case in which the terms "video signal line" and "control line" are interchanged in the following description.

First, the control line is formed, for example, as a single wiring layer with the same material as the overlying wiring layer which is lower in resistance than the layer including the high-fusion-point metal wiring made of the same material as the gate of the sampling transistor. Because of lack of contacts midway along its length, the control line has a smaller signal delay than if the same line was formed with a high-fusion-point metal. Here, the term "(signal) delay amount" is a comprehensive concept which includes degraded, if not delayed, response of the signal waveform (the same holds true for the following functions and embodiments described layer).

On the other hand, the video signal line has the above-described two-layered wiring structure. Thanks to the plurality of contact holes provided for each of the wiring connection sections between the layer including the high-fusion-point metal and the overlying wiring layer, the delay amount of the video signal is smaller than if there was only one contact hole.

Normally, when the activation timing (sampling start timing) of the control signal for the sampling transistor is set during a period of time in which the video signal pulse is maintained at the data voltage level after making a transition from the inactive level, the sampling start timing is designed to include a predetermined time margin from the above transition in the video signal pulse level.

However, if the signal delay amounts of both of the control line and video signal lines are large, it is difficult to achieve proper timings in the two wiring directions.

In the first to seventh embodiments of the present invention, one of the wirings (wiring direction of the control line) which intersect each other is a single layer wiring formed with the overlying wiring layer which has a small delay amount thanks to its small resistance. Further, the other wiring (video signal line) has the plurality of contacts to provide a reduced delay amount. This prevents sampling of incorrect levels even if the margin is set smaller in the timing design. Conversely, an increased margin prevents video quality degradation resulting from sampling of incorrect levels.

This makes all the easier a display speedup (higher-frequency driving) associated with larger screen size and higher definition.

Although relating to display devices including not only self-luminous ones such as organic EL display devices but also optical modulation ones such as liquid crystal display devices, the display devices according to the eighth and ninth embodiments provide almost the same functions as described above because these devices demand video signal sampling.

The present invention permits easy design of the sampling timing for various types of display devices including self-luminous ones such as organic EL display devices and optical modulation ones such as liquid crystal display devices, thus alleviating the difficulties involved in achieving larger screen size and higher definition and at the same time providing low-cost display devices.

BRIEF DESCRIPTION OF THE DRAWINGS

FIGS. 6A to 6I are timing diagrams illustrating the waveforms of various signals and voltages during display control according to the embodiment of the present invention;

DETAILED DESCRIPTION OF THE PREFERRED EMBODIMENT

The present invention may be applied to liquid crystal and other display devices. However, embodiments of the present invention will be described below with reference to the accompanying drawings taking, as an example, a case in which the present invention is applied to an organic EL display device.

<Overall Configuration>

Figure 1:
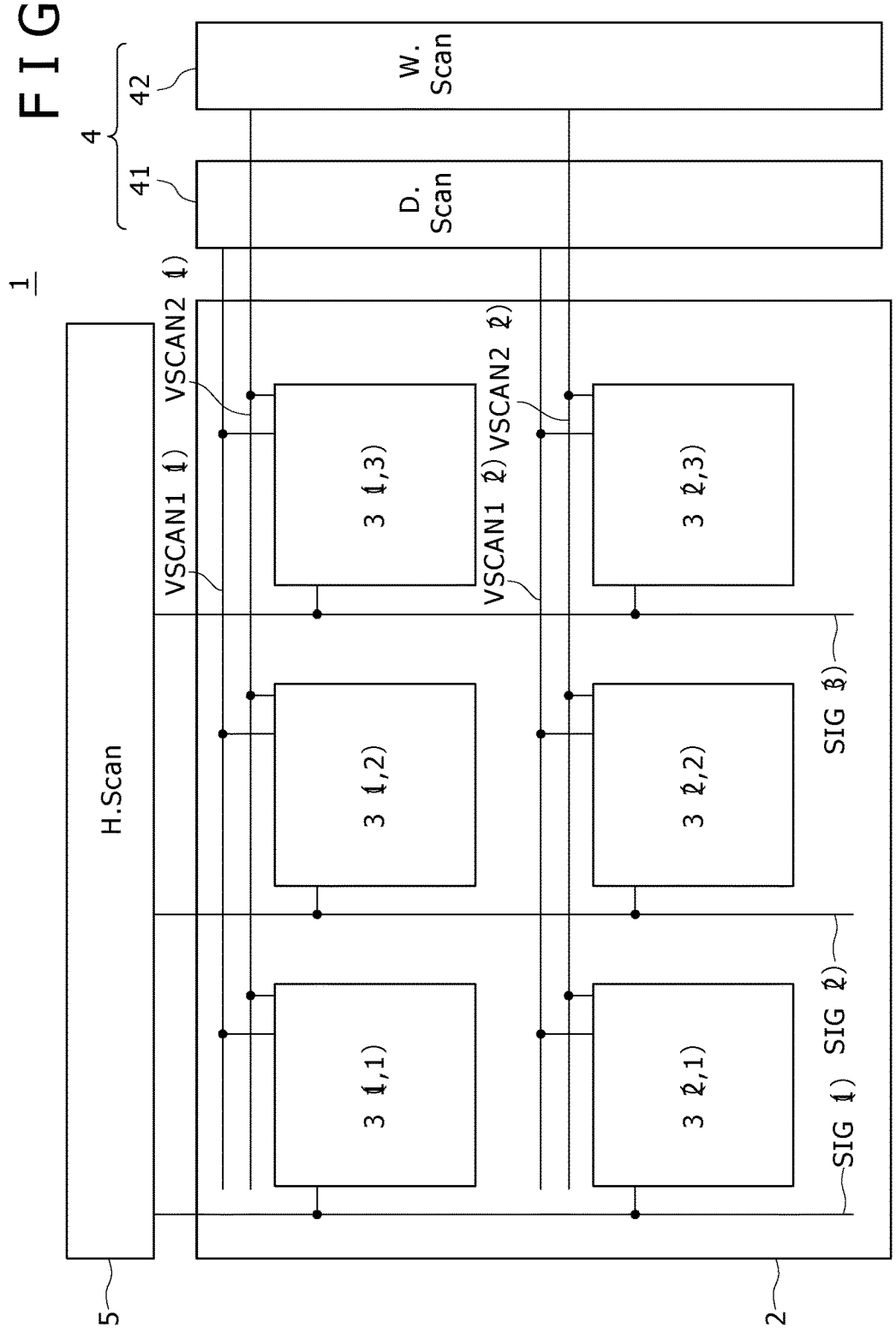
FIG. 1 is a diagram illustrating the major components of an organic EL display device according to an embodiment of the present invention.

FIG. 1 is a diagram illustrating the major components of an organic EL display device according to an embodiment of the present invention.

An organic EL display device 1 illustrated in FIG. 1 includes a pixel array 2 and drive circuit. The pixel array 2 has a plurality of pixel circuits 3 (i,j) arranged in a matrix form. The drive circuit drives the pixel array 2 and includes a vertical drive circuit (V scanner) 4 and horizontal drive circuit (H scanner or H. Scan).

The plurality of V scanners 4 are provided depending on the configuration of the pixel circuits 3. Here, the V scanner 4 includes a horizontal pixel line drive circuit (Drive Scan) 41 and write signal scan circuit (Write Scan) 42.

Reference numeral 3 (i,j) of the pixel circuits shown in FIG. 1 denotes that each pixel circuit has a vertical address i (I=1 or 2) and horizontal address j (j=1, 2 or 3). Each of these addresses i and j take on an integer equal to or greater than 1. The maximum values of i and j are "n" and "m," respectively. Here, for simplification of the diagram, a case will be shown in which n=2 and m=3.

This address notation is similarly applied to the elements, signals, signal lines, voltages and others of the pixel circuits in the description and drawings which follow.

Pixel circuits 3(1,1) and 3(2,1) are connected to a common vertical first signal line SIG(1). Similarly, pixel circuits 3(1,2) and 3(2,2) are connected to a common vertical second signal line SIG(2). Still similarly, pixel circuits 3(1,3) and 3(2,3) are connected to a common vertical third signal line SIG(3).

A first scan signal VSCAN1(1) can be applied to the pixel circuits 3(1,1), 3(1,2) and 3(1,3) in the first row from the horizontal pixel line drive circuit 41 via a common scan signal line. Similarly, a first scan signal VSCAN1(2) can be applied to the pixel circuits 3(2,1), 3(2,2) and 3(2,3) in the second row from the horizontal pixel line drive circuit 41 via a common scan signal line.

Further, a second scan signal VSCAN2(1) can be applied to the pixel circuits 3(1,1), 3(1,2) and 3(1,3) in the first row from the write signal scan circuit 42 via other common scan signal line. Similarly, a second scan signal VSCAN2(2) can be applied to the pixel circuits 3(2,1), 3(2,2) and 3(2,3) in the second row from the write signal scan circuit 42 via other common scan signal line.

<Pixel Circuit 1>

Figure 2:
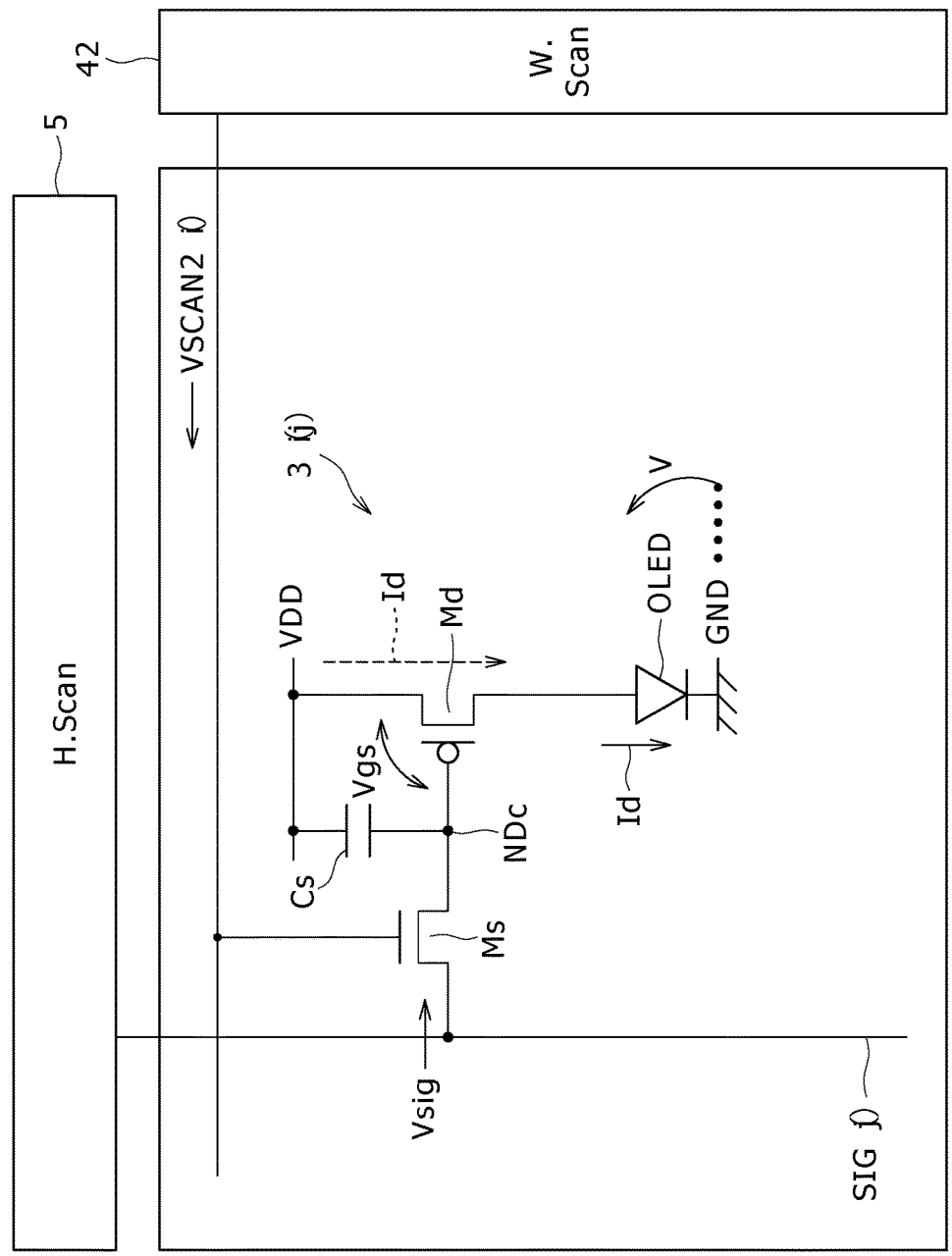
FIG. 2 is a basic configuration diagram of a pixel circuit 1 according to the embodiment of the present invention.

FIG. 2 illustrates the most basic configuration of the pixel circuit 3(i,j) when the drive transistor includes a p-channel metal oxide semiconductor (PMOS) transistor.

The pixel circuit 3(i,j) illustrated in FIG. 2 controls an organic light-emitting diode OLED serving as a light-emitting element. The pixel circuit includes a drive transistor Md, sampling transistor Ms and holding capacitor Cs, in addition to the organic light-emitting diode OLED. The drive transistor Md includes a PMOS TFT. The sampling transistor Ms includes an NMOS TFT.

Although not specifically illustrated, the organic light-emitting diode OLED has a layered body with a second electrode (cathode electrode) formed thereon. The layered body makes up an organic film. This body is formed by sequentially depositing, on a substrate made, for example, of transparent glass, a first electrode (anode electrode), hole transporting layer, light-emitting layer, electron transporting layer, electron injection layer and other layers. The anode electrode is connected to a positive first power source, and the cathode electrode to a negative second power source. It should be noted that the anode electrode may be positive, and the cathode electrode negative. In this case, the anode electrode is connected to the second power source, and the cathode electrode to the first power source.

It should be noted that FIG. 2 illustrates a case in which the anode of the organic light-emitting diode OLED is supplied with a source voltage VDD from the positive first power source, and that the cathode thereof is connected to a reference voltage such as ground voltage GND.

When a predetermined bias voltage is applied between the cathode and anode of the organic light-emitting diode OLED, the injected electrons and holes recombine in the light-emitting layer, thus emitting light. Because the organic light-emitting diode OLED can emit any of red (R), green (G) and blue (B) lights by proper selection of the organic material making up the organic film, the same diode OLED is capable of displaying a color image, for example, if the pixels are arranged in each row in such a manner that R, G and B lights are emitted. Alternatively, a white light-emitting organic material may be used, with the distinction between R, G and B made using filter colors. Still alternatively, four colors, namely, R, G, B and W (white), may be used instead.

The drive transistor Md functions as a current control section adapted to control the amount of current flowing through the organic light-emitting diode OLED so as to determine the display gray level.

The drive transistor Md has its source connected to the supply line of the source voltage VDD and its drain connected to the anode of the organic light-emitting diode OLED.

The sampling transistor Ms is connected between a supply line (signal line SIG(j)) of a data potential Vsig and the gate (control node NDc) of the drive transistor Md. The data potential Vsig determines the pixel gray level. The same transistor Ms has one of its source and drain connected to the gate of the drive transistor Md and the other thereof connected to the video signal line SIG(j). The data potential Vsig is applied to the signal line SIG(j) from the H scanner 5. The sampling transistor Ms samples the data having the level to be displayed by the pixel circuit at a proper timing during this data potential application period. This is done to eliminate the adverse impact of unstable level during the transition period on the display image.

The holding capacitor Cs is connected between the supply line of the source voltage VDD and the gate of the drive transistor Md. The roles of the holding capacitor Cs will be described later in relation to the operation.

It should be noted that the components controlled by the horizontal pixel line drive circuit 41 are omitted in FIG. 2. An example of such components may be, for example, another transistor connected between the supply line of the source voltage VDD and the gate of the drive transistor Md. Alternatively, another example of such components may be that adapted to repeatedly apply the source voltage VDD for a predetermined time at constant intervals. Such components are provided for purposes of drive scan. However, they are omitted in FIG. 2 because of many schemes available for drive scan.

<Pixel Circuit 2>

Figure 3:
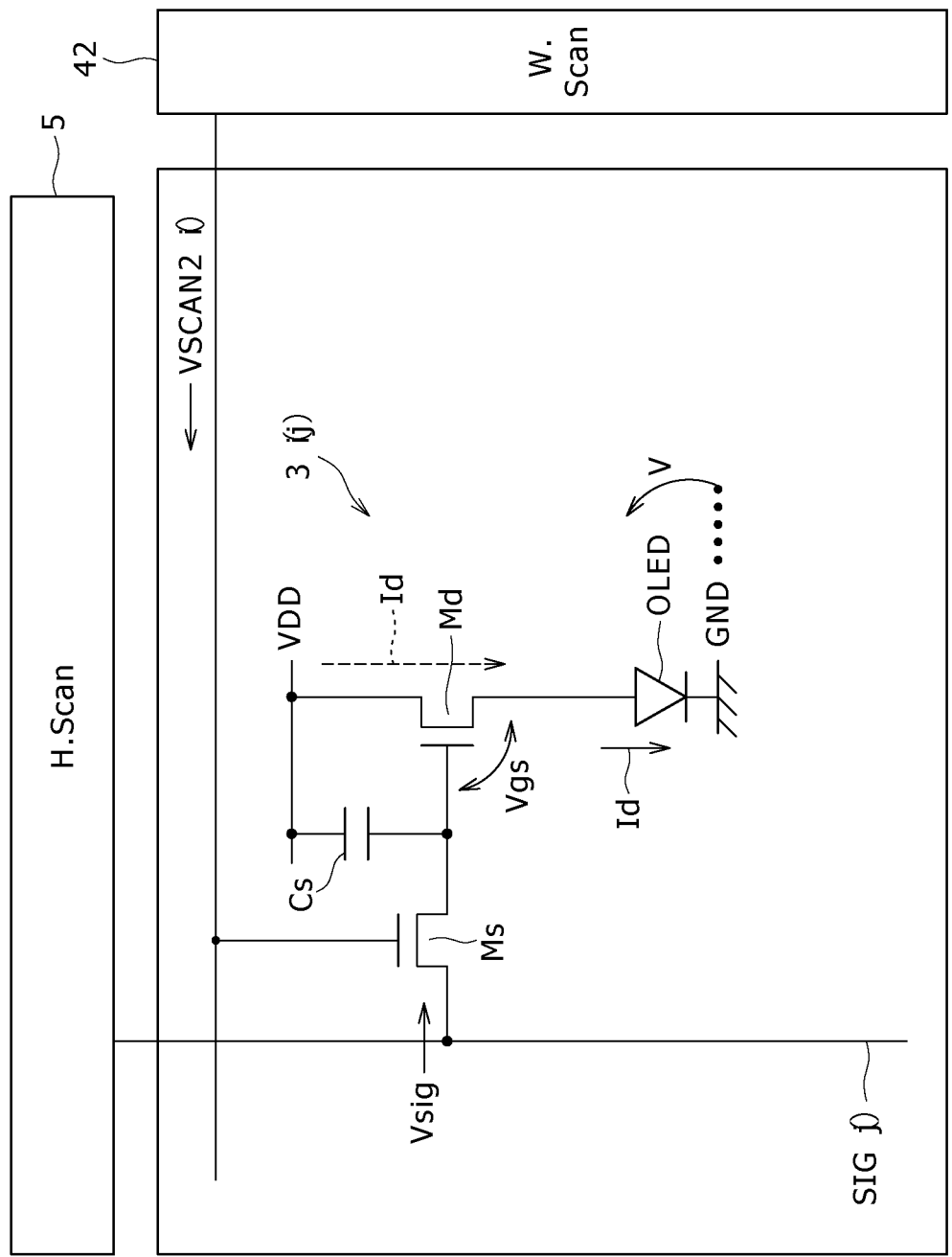
FIG. 3 is a basic configuration diagram of a pixel circuit 2 according to the embodiment of the present invention.

FIG. 3 illustrates the most basic configuration of the pixel circuit 3(i,j) when the drive transistor includes an N-channel metal oxide semiconductor (NMOS) transistor.

The pixel circuit 3(i,j) illustrated in FIG. 3 is similar to that in FIG. 2 except that the drive transistor Md is of different channel conductivity type from the one shown in FIG. 2. Using an NMOS transistor as the drive transistor Md offers two advantages. Firstly, a large drive current can be used per unit size. Secondly, N-channel transistors can be used for all the transistors in the pixel circuit, thus providing a simpler manufacturing process.

It should be noted that all transistors in the pixel circuits 1 and 2 are formed by TFTs. The thin film semiconductor layer used to form the TFTs is made of a semiconductor material such as polysilicon or amorphous silicon. Polysilicon TFTs can have a high mobility but vary significantly in their characteristics, which makes these TFTs unfit for achieving a larger screen size of the display device. Therefore, amorphous TFTs are generally used in a display device having a large screen. It should be noted, however, that P-channel TFTs are difficult to form with amorphous silicon TFTs. As a result, the pixel circuit 2 or a pixel circuit based thereon should preferably be used.

Here, the above-described pixel circuits 1 and 2 are examples of a pixel circuit applicable to the present embodiment, i.e., basic examples of a two-transistor (2T) one-capacitor (1C) configuration. Therefore, the pixel circuit which can be used in the present embodiment may have an additional transistor and/or capacitor in addition to the pixel circuit 1 or 2 as a basic configuration. More specifically, the pixel circuit applicable to the present embodiment may have, for example, any of 4T1C, 4T2C and 5T1C pixel circuits, though detailed description is omitted.

<Outline of Light Emission Control>

The light emission control operation of the above two pixel circuits can be briefly described as follows.

The holding capacitor Cs is coupled to a control node NDc of the drive transistor Md. The signal voltage Vsig from the signal line SIG(j) is sampled by the sampling transistor Ms. The obtained data potential Vsig is applied to the control node NDc.

Figure 4:
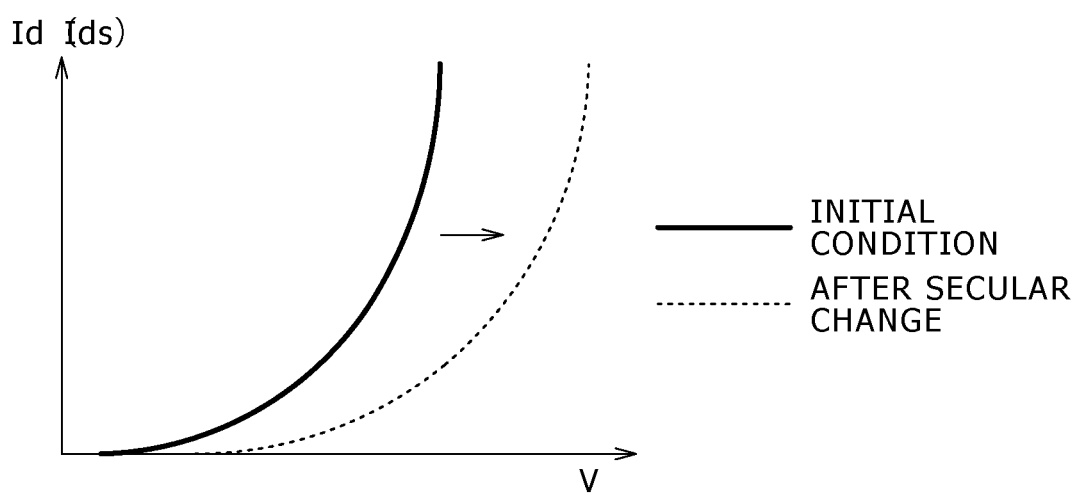
FIG. 4 is a graph and equation illustrating the characteristic of an organic light-emitting diode.

FIG. 4 illustrates the I-V characteristic graph of the organic light-emitting diode OLED and a general equation of a drain current Ids of the drive transistor Md (corresponds to a drive current Id of the OLED).

When the predetermined data potential Vsig is applied to the gate of the drive transistor Md, the P-channel drive transistor Md in the case of the pixel 1 shown in FIG. 2 is designed to operate in the saturation region at all times with its source connected to the power source. As a result, the P-channel drive transistor Md functions as a constant current source having a current level denoted by the equation shown in FIG. 4. The drain current Ids supplied by this constant current source is determined by a gate-to-source voltage Vgs whose level is commensurate with the data potential applied to the gate of the P-channel drive transistor Md. Therefore, the organic light-emitting diode OLED emits light at the brightness commensurate with the post-sampling data potential Vsig.

As is well known, the I-V characteristic of the organic light-emitting diode OLED changes as illustrated in FIG. 4 due to secular change. At this time, the constant current source attempts to supply the same level of the drive current Id. This increases a voltage V applied to the organic light-emitting diode OLED, pushing up the drain potential of the P-channel drive transistor Md. However, the gate-to-source voltage Vgs of the same transistor Md remains constant. Therefore, the constant drive current Id flows through the same diode OLED. As a result, the light emission brightness remains unchanged.

In the case of the pixel 2 shown in FIG. 3 having an N-channel transistor as the drive transistor Md rather than a P-channel one, the same transistor Md has its source connected to the organic light-emitting diode OLED. As a result, the gate-to-source voltage Vgs changes with change of the same OLED over time.

This changes the drive current Id flowing through the organic light-emitting diode OLED, thus changing the light emission brightness even if the data potential Vsig is at the predetermined level.

Further, a threshold voltage Vth and mobility μ of the drive transistor Md are different from one pixel circuit to another. This leads to a variation in the drain current Ids according to the equation shown in FIG. 4, thus changing the light emission brightness between different pixels even if the supplied data potential Vsig is the same.

It should be noted that, in the equation shown in FIG. 4, reference numeral Ids represents the current flowing between the drain and source of the drive transistor Md operating in the saturation region. Further, in the drive transistor Md, reference numeral Vth represents the threshold voltage, p the mobility, W the effective channel width (effective gate width), and L the effective channel length (effective gate length). Still further, reference numeral Cox represents the unit gate capacitance of the drive transistor Md, namely, the sum of the gate oxide film capacitance per unit area and the fringing capacitance between the source (or drain) and gate.

The pixel circuit having the N-channel drive transistor Md is advantageous in that it offers high driving capability and permits simplification of the manufacturing process. To suppress the variation in the threshold voltage Vth and mobility μ, however, the following correction operations are demanded before the above-described light emission control operation.

<Outline of the Corrections>

Although a detailed description will be given later, the gate-to-source voltage Vgs of the drive transistor Md is maintained at the level of the threshold voltage Vth by the holding capacitor Cs before the sampling. This preliminary operation is called the "threshold correction."

A post-sampling data voltage Vin is added to the gate of the drive transistor Md after the threshold correction. Therefore, the gate-to-source voltage Vgs changes to "Vth+Vin" and is maintained at this level. The drive transistor Md turns on according to the magnitude of the data voltage Vin. If the drive transistor Md does not easily turn on because of its large threshold voltage Vth, "Vth+Vin" is also large. In contrast, if the drive transistor Md easily turns on because of its small threshold voltage Vth, "Vth+Vin" is also small. This eliminates the impact of variation in the threshold voltage Vth from the drive current, thus maintaining the drain current Ids (drive current Id) constant for the constant data voltage Vin.

Further, a "mobility correction" (driving capability correction to be precise) is performed, for example, before the data sampling and after the threshold voltage correction.

The mobility correction changes the gate potential further according to the current driving capability of the drive transistor Md with the voltage "Vth+Vin" maintained constant. Although not illustrated in FIGS. 2 and 3, the drive transistor Md has a path between its gate and source or drain. This path charges or discharges the holding capacitor with the current supplied via the current channel of the same transistor Md. The mobility correction is performed by controlling whether or not to pass a current through this path.

Then, the organic light-emitting diode OLED emits light as it is driven by this constant current.

<Pixel Circuit 3>

Figure 5:
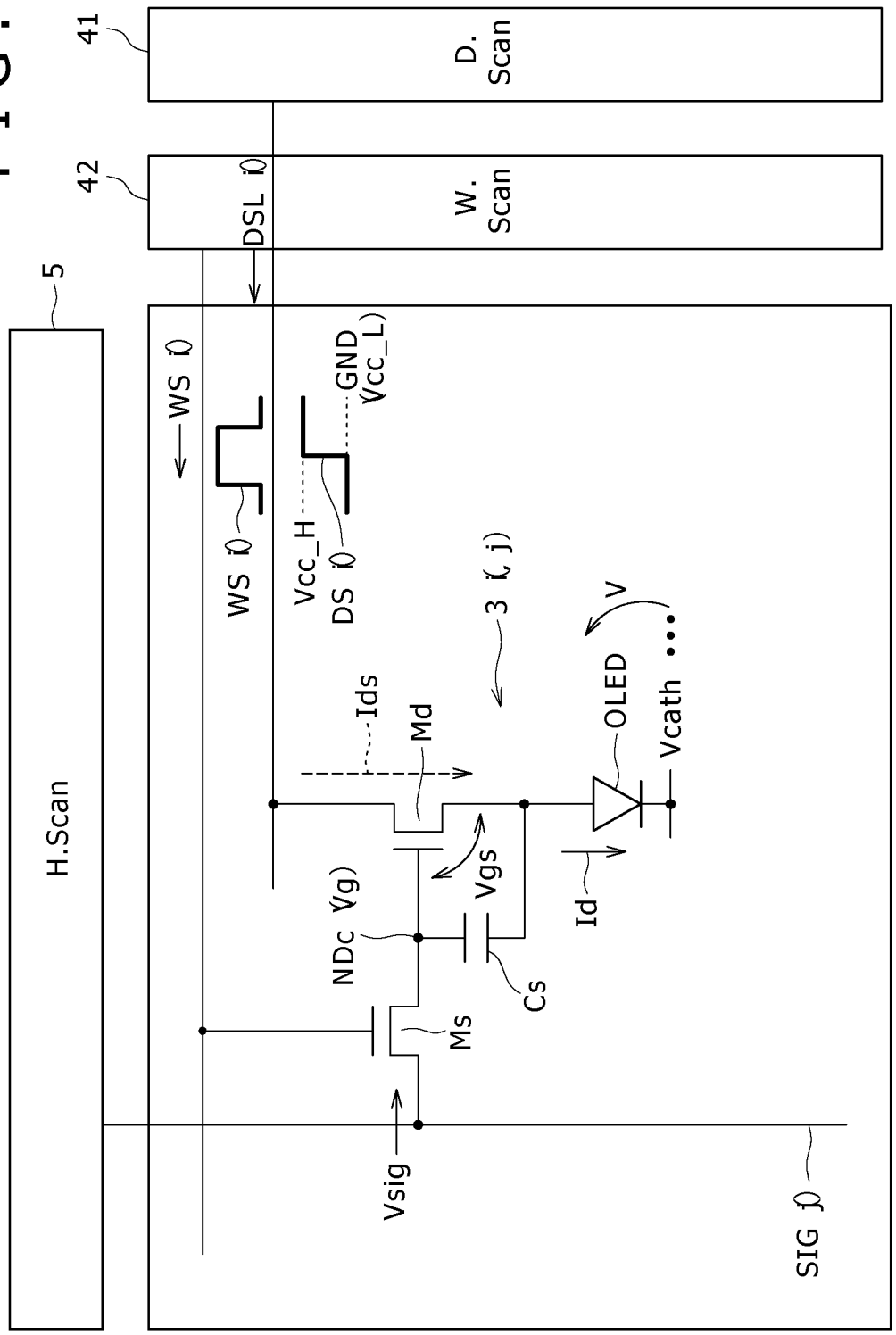
FIG. 5 is a basic configuration diagram of a pixel circuit 3 according to the embodiment of the present invention.

FIG. 5 illustrates a modification example of the pixel circuit 2 which takes into account the above charging-discharging path during the mobility correction.

In the pixel circuit shown in FIG. 5, the holding capacitor Cs is connected between the gate and source of the drive transistor Md rather than between the gate and drain thereof as illustrated in FIG. 3. The pixel circuit in FIG. 5 is identical to that in FIG. 3 in other configuration. It should be noted, however, that, here, power driving is achieved by driving the drain voltage of the drive transistor Md between high level (e.g., source voltage VDD) and low level (reference voltage VSS such as negative potential) using a power source drive pulse DS(i) (notation of a first scan signal VSCAN1(i) shown in FIG. 1 as a pulse). The same pulse DS(i) is supplied from the horizontal pixel line drive circuit 41. Further, a video signal Ssig (data potential Vsig) is sampled by the sampling transistor Ms using a write drive pulse WS(i) (notation of a second scan signal VSCAN2(i) shown in FIGS. 1 and 3). The same pulse WS(i) is supplied from the write signal scan circuit 42.

It should be noted that although the power driving of the pixel circuit 3 is not limited to that shown in FIG. 5, we assume, for convenience of concrete description given later, that the power driving method shown in FIG. 5 is used.

<Detailed Example of the Display Control>

A description will be given of the operation of the circuit shown in FIG. 5 during the data write operation together with the threshold voltage and mobility correction operations. This series of operations are referred to as the "display control."

FIGS. 6A to 6I are timing diagrams illustrating the waveforms of various signals and voltages during the display control. Here, we assume that data is written on a row-by-row basis during the display control. Therefore, the first row having the pixel circuits 3(1,j) is the target row (display row). As a result, the second and third rows having the pixel circuits 3(2,j) and 3(3,j) are not the target rows (non-display rows) at the point in time shown in FIGS. 6A to 6I. Data is written to the display row through the display control which will be described below. Then, the display row changes to the second row which undergoes the same display control. The same display control is repeated on the third, fourth and subsequent rows, thus allowing a screen to be displayed. After a screen is displayed, the display control is repeated the demanded number of times to display other screens in the same manner.

FIG. 6A is a waveform diagram of the video signal Ssig.

FIGS. 6B and 6C are waveform diagrams of a write drive pulse WS(1) and power drive pulse DS(1) supplied to the first row to which data is to be written. Similarly, FIGS. 6D and 6E are waveform diagrams of a write drive pulse WS(2) and power drive pulse DS(2) supplied to the second row to which data is not to be written. FIGS. 6F and 6G are waveform diagrams of a write drive pulse WS(3) and power drive pulse DS(3) supplied to the third row to which data is not to be written.

FIG. 6H is a waveform diagram of the gate potential of the drive transistor Md (potential of the control node NDc) in the pixel circuit 3(1,j) in the first row to which data is to be written.

FIG. 6I is a waveform diagram of the source potential of the drive transistor Md (anode potential of the organic light-emitting diode OLED) in the pixel circuit 3(1,j) in the first row to which data is to be written.

[Definitions of the Periods]

As illustrated at the bottom of FIG. 6I, FIGS. 6A to 6I show the waveform diagrams over a time span about slightly more than four times one horizontal period (1H) of the National Television system committee (NTSC) video signal standard. In the last horizontal period (1H), not only the last or third threshold correction (VTC3) but also the mobility correction and actual data write (W& μ) are performed continuously (main operation). The three horizontal periods ((1H)×3) preceding the last horizontal period (1H) are spent on performing the threshold correction twice in advance so that the correction progresses to a certain extent. This is done in consideration of the fact that the final threshold correction may be too short to correct the threshold properly (preliminary operation).

With the display panel drive frequency already extremely high today, the display control as shown in FIGS. 6A to 6I is unable to complete all operations from the threshold voltage correction to data write within a short one horizontal period (1H). Therefore, the threshold correction is performed in several steps because of the lack of time available for the threshold correction. It should be noted, however, that if one horizontal period (1H) is enough for the main operation as in small- and medium-sized display panels, one horizontal period (1H) may be enough to perform the initialization for the preliminary operation. Of course, the preliminary operation may last for two horizontal periods (2H), or more than four horizontal periods (4H).

When the main operation is conducted for a certain row, the preliminary operation can be performed for the next (and subsequent rows). Therefore, the length of the preliminary operation time hardly affects the display period as a whole. Rather, the preliminary operation should preferably be conducted in a sufficient manner to ensure positive completion of the threshold voltage correction.

The above classification is based on a fixed measure, i.e., one horizontal period (1H). However, it is also possible to functionally understand the roughly four horizontal periods shown in FIG. 6I.

More specifically, as illustrated at the top of FIG. 6A, a light emission period (LMO) for the screen preceding by one field (or frame) is followed by the "preliminary operation." The preliminary operation includes, in chronological order, a discharge period (D-CHG), initialization period (INT), first threshold correction period (VTC1), first standby period (WAT1), second threshold correction period (VTC2) and second standby period (WAT2). The preliminary operation is followed by the "main operation." The main operation includes, in chronological order, a third threshold correction period (VTC3), third standby period (WAT3) and writing and mobility correction period (W& μ). The main operation is followed by a light emission period (LM1) for the pixel circuits 3(1,j) in the first row.

[Outline of the Drive Pulse]

Further, reference numerals T0 to T21 are shown as appropriate in the waveform diagrams of FIGS. 6A to 6I to denote different times. Next, the video signal and drive pulse will be outlined with reference to these times.

In the case of the write drive pulse WS(1) supplied to the first row, four sampling pulses (SP0 to SP3), which are inactive at low level and active at high level, appear in a periodic manner. At this time, these pulses (SP0 to SP3) occur at constant intervals throughout the preliminary operation (time T0 to time T15) and main operation (after time T15). It should be noted, however, that the write drive pulse WS(1) in the main operation has a waveform in which a write pulse (WP) is added after the fourth sampling pulse (SP3).

On the other hand, the video signal Ssig is supplied to the m (several hundred to one thousand and several hundred) signal lines SIG(j) (refer to FIGS. 1 and 5). The same signal Ssig is supplied simultaneously to the m video signal lines Sig(j) in line sequential display. As illustrated in FIG. 6A, the signal amplitude Vin reflecting the data voltage obtained after the sampling of the video signal Ssig corresponds to the peak value of a video signal pulse (PP) which appears repeatedly in the second half of one horizontal period (1H).

This peak value is relative to an offset potential (Vofs) which appears in the first half of one horizontal period (1H). The signal amplitude Vin will be hereinafter referred to as the data voltage Vin.

Of the several video signal pulses (PP) shown in FIG. 6A, the pulse (PPx) appearing during the main operation is essential for the first row. This pulse coincides in time with the write pulse (WP). The peak value of the video signal pulse (PPx) relative to the offset potential (Vofs) corresponds to the gray level to be displayed (written) shown in FIGS. 6A to 6I, i.e., the data voltage Vin. This gray level (=Vin) may be the same for all pixels in the first row (for monochrome display). Normally, however, this level changes according to the gray level of the display pixel row. FIGS. 6A to 6I are intended primarily to describe the operation of one of the pixels in the first row. However, the driving of other pixels in the same row is in itself controlled in parallel with the driving of the single pixel illustrated in FIGS. 6A to 6I except that the display gray level may be different between the pixels.

The power drive pulse DS(1) applied to the drain of the drive transistor Md (refer to FIG. 5) is maintained at inactive low level as illustrated in FIG. 6C from time T0 to immediately prior to the beginning (time T6) of the first threshold correction period (VTC1). The inactive low level is, for example, the reference voltage VSS (e.g., negative voltage). Then, the power drive pulse DS(1) changes to active high level (e.g., source voltage VDD) almost simultaneously with the beginning (time T6) of the first threshold correction period (VTC1). The same pulse DS(1) is maintained at the source voltage VDD until the end of the light emission period (LM1).

As illustrated in FIGS. 6D, 6E, 6F and 6G, the pulses WS and DSL are applied to the pixel circuits 3(2,j) and 3(3,j) in the second and third rows respectively with a delay of one horizontal period.

More specifically, the first sampling pulse (SP0) for the initialization period (INT) is applied to the second row from time T5 to T7 during which the second sampling pulse (SP1) for the first threshold correction period (VTC1) is applied to the first row.

While this pulse is applied, that is, at time T6, the power drive pulse DS(1) for the first row changes to high level (source voltage VDD), which activates this pulse.

Then, the second sampling pulse (SP1) is applied to the second row with a delay of one horizontal period (1H) from that applied to the first row from time T10 to T12 during which the third sampling pulse (SP2) for the second threshold correction period (VTC2) is applied to the first row. During the same time period, the first sampling pulse (SP0) is applied to the third row with a delay of two horizontal periods ((1H)×2) from that applied to the first row.

While this pulse is applied, that is, at time T11, the power drive pulse DS(2) for the second row changes to high level (source voltage VDD), which activates this pulse.

Then, the third sampling pulse (SP2) is applied to the second row with a delay of one horizontal period (1H) from that applied to the first row from time T15 to T17 during which the fourth sampling pulse (SP3) for the third threshold correction period (VTC3) is applied to the first row. During the same time period, the second sampling pulse (SP1) is applied to the third row with a delay of two horizontal periods ((1H)×2) from that applied to the first row.

While this pulse is applied, that is, at time T16, the power drive pulse DS(3) for the third row changes to high level (source voltage VDD), which activates this pulse.

Designing the pulse application timings as described above makes it possible to perform, in parallel with the main operation of a given row, the preliminary operation of other rows whose main operation will be performed one or more horizontal periods later. As far as the main operation is concerned, it is conducted on a row-by-row basis in a seamless manner. Therefore, there is no waste of time except for the first several horizontal periods.

Because the display screen normally includes several hundred to one thousand and several hundred rows, one to several horizontal periods during the display of one screen is negligibly small. Therefore, there is substantially no time loss even when the threshold correction is performed in several steps.

A description will be given next of the changes in potential of the source and gate of the drive transistor Md shown in FIGS. 6H and 6I and the operation associated with these changes when the pulses are controlled as described above. This description will be given for each of the periods shown in FIG. 6A.

It should be noted that, here, reference will be made, as appropriate, to the explanatory diagram of the preliminary operation of the pixel circuit 3(1,j) in the first row shown in FIGS. 7A to 9B, graph of the change in the source potential Vs over time shown in FIG. 10, explanatory diagram of the main operation of the pixel circuit 3(1,j) in the first row shown in FIGS. 11A to 11C and also to other drawings such as FIG. 5.

[Light Emission Period for the Previous Screen (LM0)]

For the pixel circuit 3(1,j) in the first row, the write drive pulse WS(1) is at low level as illustrated in FIG. 6B during the light emission period (LM0) for the screen preceding by one field or frame earlier than time T0 (hereinafter referred to as the previous screen). As a result, the sampling transistor Ms is off. At this time, on the other hand, the power drive pulse DS(1) is at the level of the source voltage VDD as illustrated in FIG. 6C.

Figure 7A:
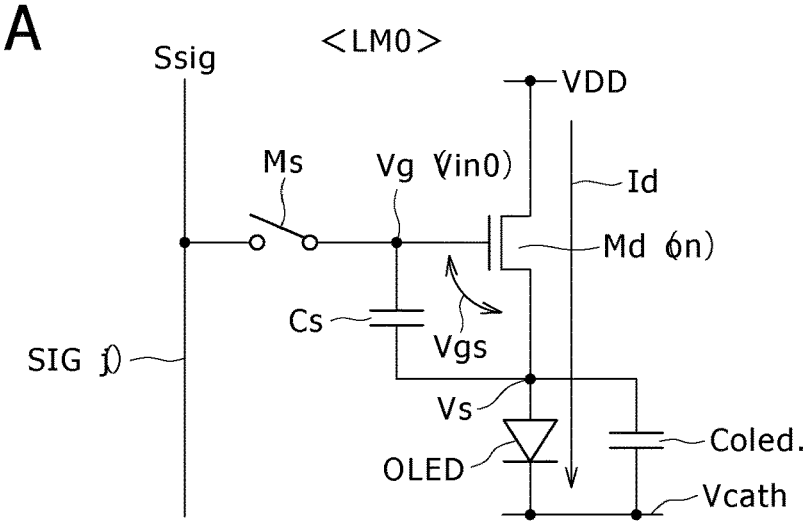
FIGS. 7A to 7C are diagrams describing the operation until sampling.

At this time, as illustrated in FIG. 7A, the organic light-emitting diode OLED is emitting light according to a data voltage Vin0. The same voltage Vin0 is held after being fed to the gate of the drive transistor Md by the data write operation for the previous screen. The drive transistor Md is designed to operate in the saturation region. Therefore, the drive current Id (=Ids) flowing through the organic light-emitting diode OLED takes on the value calculated by the equation shown in FIG. 4 according to the gate-to-source voltage Vgs of the drive transistor Md held by the holding capacitor Cs.

[Discharge Period (D-CHG)]

The processes adapted to display a new screen by line sequential scan begin from time T0 in FIGS. 6A to 6I.

At time T0, the horizontal pixel line drive circuit 41 (refer to FIG. 5) changes the power drive pulse DS(1) from the source voltage VDD to the reference voltage VSS as illustrated in FIG. 6C. In the drive transistor Md, the potential of the node which has been functioning as the drain until that time is sharply pulled down to the reference voltage VSS. As a result, the relationship in potential between the source and drain is reversed. Therefore, the node which has been functioning as the drain serves as the source, and the node which has been functioning as the source as the drain to discharge the charge from the drain (however, reference numeral Vs remains unchanged as the source potential).

Figure 7B:
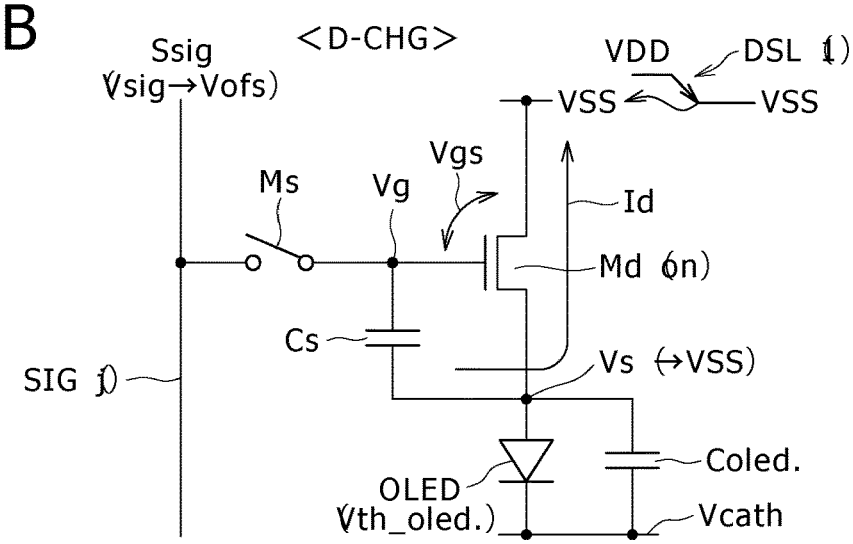

Therefore, the drain current Ids flows in reverse direction through the drive transistor Md as illustrated in FIG. 7B.

The period of time during which the current flows in reverse direction through the same transistor Md is written as the discharge period (D-CHG) in FIGS. 6A to 6I.

When the discharge period (D-CHG) begins, the source potential Vs (drain potential in the practical operation) of the drive transistor Md discharges sharply from time T0 as illustrated in FIG. 6I, causing the same potential Vs to decline close to the reference voltage VSS.

At this time, if the reference voltage VSS is smaller than the sum of a threshold voltage Vth_oled. and a cathode potential Vcath of the organic light-emitting diode OLED, i.e., VSS<Vth_oled.+Vcath, then the same diode OLED will stop emitting light.

It should be noted that the potential of the video signal Ssig is pulled down from the data potential Vsig to the offset potential Vofs prior to the end (time T1) of the discharge period (D-CHG), as illustrated in FIG. 6A.

At time T0, the sampling transistor Ms is off as illustrated in FIG. 7B, causing the control node NDc to float. As a result, the gate voltage Vg of the drive transistor Md declines from time T0 as illustrated in FIG. 6H.

[Initialization Period (INT)]

Next, the write signal scan circuit 42 (refer to FIG. 5) changes the write drive pulse WS(1) from low to high level at time T1 as illustrated in FIG. 6B, thus supplying the first sampling pulse (SP0) to the gate of the sampling transistor Ms.

At time T1, the discharge period (D-CHG) ends, initiating the initialization period.

Figure 7C:
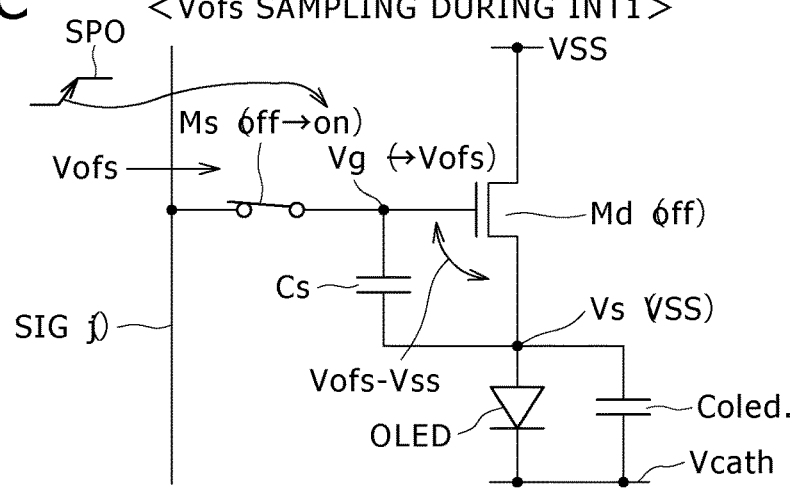

In response to the application of the sampling pulse (SP0) at time T1, the sampling transistor Ms turns on as illustrated in FIG. 7C. As described earlier, the potential of the video signal Ssig is changed to the offset potential Vofs by time T1. Therefore, the sampling transistor Ms samples the offset potential Vofs of the video signal Ssig and transfers the post-sampling offset potential Vofs to the gate of the drive transistor Md.

This sampling operation causes the gate voltage Vg of the drive transistor Md, which declined from time T0, to converge to the offset potential Vofs, as illustrated in FIG. 6H.

The sampling pulse (SP0) shown in FIG. 6B begins from time T1 and ends at time T2 when a sufficient time has elapsed for the convergence of the potential, thus turning off the sampling transistor Ms. As a result, the gate of the drive transistor Md floats until time T5 when the sampling transistor Ms turns on the next time.

The sampling transistor Ms is controlled to turn on again at time T5 almost at the same time as the end of the first horizontal period (1H). Further, the same transistor Ms turns on again so that the video signal pulse (PP) fits into the first horizontal period (1H) (refer to FIGS. 6A and 6B).

If this is viewed from the standpoint of the sampling pulse (SP0), the duration of the same pulse (SP0) (time T1 to T2) adapted to raise the write drive pulse WS(1) to high level is in the first half of the horizontal period (1H) and falls within the period of time (time T0 to T3) during which the video signal Ssig is at the offset potential Vofs.

Then, at time T2, the sampling transistor Ms is turned off. With the sampling transistor Ms turned off, there is a wait until time T4 when the variation in potential of the signal line SIG(j) by the video signal pulse (PP) ends. Then, at time T5, the second sampling pulse (SP1) is activated to sample the offset potential Vofs again.

This control prevents the data potential Vsig of the video signal Ssig to be erroneously sampled at time T5 when the second sampling pulse (SP1) is activated.

It should be noted that, as illustrated in FIG. 6H, the gate voltage Vg is already at the offset potential Vofs when the second sampling begins at time T5. In general, therefore, the gate voltage Vg barely changes although the second sampling may make up for an extremely small loss caused, for example, by leak current.

Going slightly back to the description made on the time axis, the sampling transistor Ms turns on at time T1 as a result of the application of the first sampling pulse (SP0). When the gate voltage Vg of the drive transistor Md converges to the offset potential Vofs as illustrated in FIG. 6H, the voltage held by the holding capacitor Cs declines to "Vofs−VSS" (FIG. 6I). This decline is caused by the fact that the discharge shown in FIG. 7B has pushed the source potential Vs down to the reference voltage VSS and that the voltage held by the holding capacitor Cs is restricted by the gate voltage Vg relative to the reference voltage VSS. That is, as the gate voltage Vg drops to the offset potential Vofs, the voltage held by the holding capacitor Cs also drops and converges to "Vofs−VSS." It should be noted that this held voltage "Vofs−VSS" is none other than the gate-to-source voltage Vgs. Unless the same voltage Vgs is greater than the threshold voltage Vth of the drive transistor Md, the threshold voltage correction operation cannot be performed later. As a result, the potential relationship is established so that "Vofs−VSS>Vth."

As described above, the preparations for the threshold correction operation are completed by initializing the gate voltage Vg and source potential Vs of the drive transistor Md.

[First Threshold Correction Period (VTC1)]

The sampling transistor Ms begins to sample the offset potential Vofs the second time at time T5. Then, when the power drive pulse DS(1) rises from the VSS level to the VDD level at time T6, the initialization period (INT) ends, initiating the first threshold correction period (VTC1).

The sampling transistor Ms which is on is sampling the offset potential Vofs immediately prior to time T6, the beginning of the first threshold correction period (VTC1). Therefore, the gate voltage Vg of the drive transistor Md is electrically fixed at the constant offset potential Vofs.

In this condition, the horizontal pixel line drive circuit 41 (refer to FIG. 5) raises the power drive pulse DS(1) from low level (=VSS) to high level (=VDD) at time T6 as illustrated in FIG. 6C. From time T6 onward, the same circuit 41 maintains the potential of the power supply line to the drive transistor Md at the source voltage VDD until the beginning of the processes for the next frame (or field).

As the power drive pulse DS(1) rises to high level, the "VDD−VSS" voltage is applied between the source and drain of the drive transistor Md. This causes the drain current Ids to flow through the drive transistor Md.

The drain current Ids charges the source of the drive transistor Md, thus pushing up the source potential Vs as illustrated in FIG. 6I. As a result, the gate-to-source voltage Vgs (voltage held by the holding capacitor Cs) of the drive transistor Md which has taken on the value "Vofs−VSS" up until that time declines gradually (FIGS. 6H and 6I).

At this time, the source of the drive transistor Md is not charged very quickly by the drain current Ids. The reasons for this will be given below with reference to FIG. 8A.

Figure 8A:
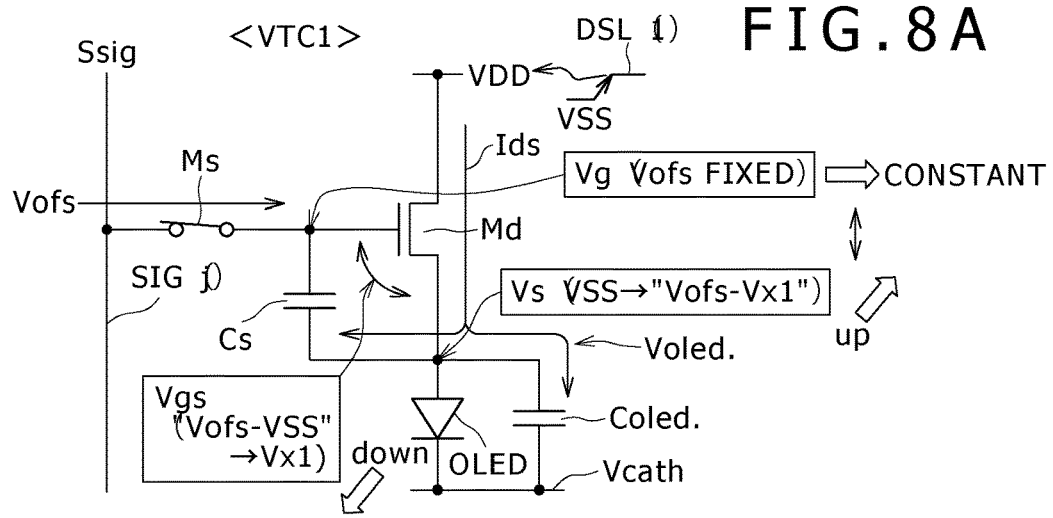
FIGS. 8A to 8C are diagrams describing the operation until a second threshold correction.
Figure 8B:
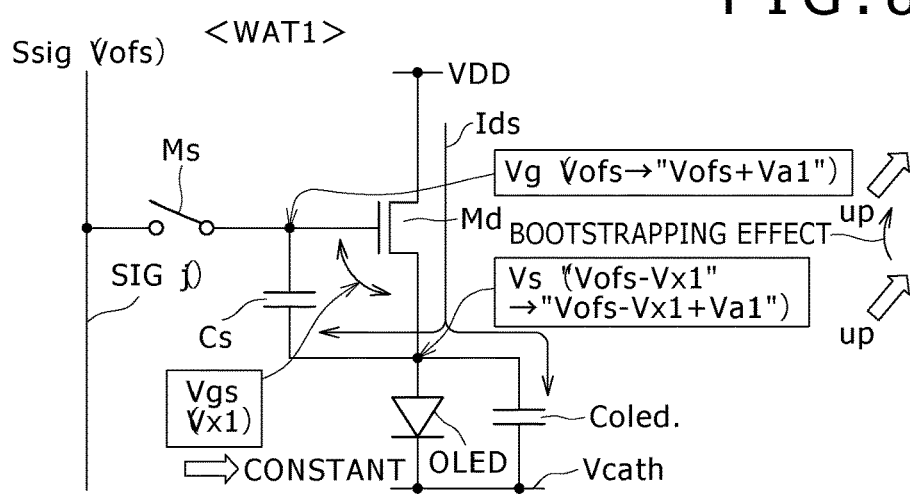

As illustrated in FIG. 8A, a gate bias voltage applied to the gate of the drive transistor Md is not very large because this voltage is restricted by the offset voltage Vofs. Therefore, the drive transistor Md is only slightly on, that is, is on with only limited driving capability (first reason).

Further, although the drain current Ids flows into the holding capacitor Cs, the same current Ids is also consumed to charge a capacitance Coled. of the organic light-emitting diode OLED. As a result, the source potential Vs does not readily increase (second reason).

Still further, the sampling pulse (SP1) must be terminated at time T7 which is before time T8 when the video signal Ssig changes to the data potential Vsig the next time (refer to FIG. 6B). Therefore, the charging time of the source potential Vs is not sufficient (third reason).

Figure 10:
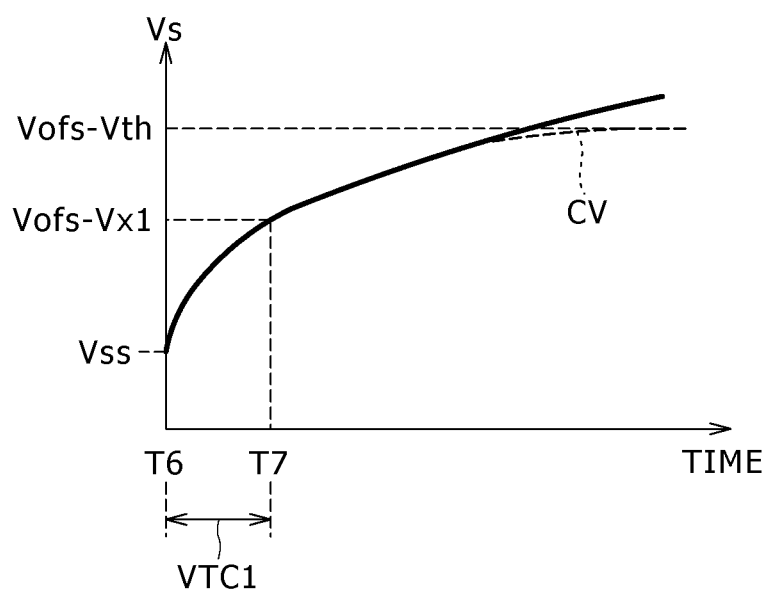
FIG. 10 is a graph illustrating the change in source potential over time according to the embodiment of the present invention.

Assuming that the second sampling pulse (SP1) shown in FIG. 6B can last for a sufficiently long time beyond time T7, the source potential Vs of the drive transistor Md (anode potential of the organic light-emitting diode OLED) begins to increase from time T6 and continues to do so over time and eventually converges to "Vofs−Vth" (curve CV shown by a dashed line in FIG. 10). That is, the source potential Vs should stop increasing when the gate-to-source voltage Vgs (voltage held by the holding capacitor Cs) exactly matches the threshold voltage Vth of the drive transistor Md.

[First Standby Period (WAT1)]

Practically, however, time T7 comes before the convergence point is reached. This terminates the duration of the sampling pulse (SP1), thus terminating the first threshold correction period (VTC1) and initiating the first standby period (WAT1).

More specifically, when the gate-to-source voltage Vgs of the drive transistor Md becomes equal to Vx1 (>Vth), that is, when the source potential Vs of the same transistor Md rises to "Vofs−Vx1" from the reference voltage VSS (at time T7), the first threshold correction period (VTC1) ends. At this time (time T7), the voltage Vx1 is held by the holding capacitor Cs.

When the first threshold correction period (VTC1) ends, the sampling transistor Ms turns off. This places the gate of the drive transistor Md, which has been electrically fixed at the offset potential Vofs, in a floating state.

From time T7 onward, therefore, as the source potential Vs rises, the potential of the gate in a floating state capacitively coupled to the source will also rise (FIGS. 6H and 6I). As a result, in the present example, the source potential Vs increases toward the target convergence point "Vofs−Vth" (refer to FIG. 10) at the end (time T10) of the first standby period (WAT1). On the other hand, the gate-to-source voltage Vgs remains unchanged as illustrated in FIGS. 6H and 6I.

As in the initialization period (INT) described earlier, it is necessary to wait for the video signal pulse (PP) to elapse in the first standby period (WAT1). Therefore, this period is called the "standby period" in this respect. However, a relatively long standby period as that lasting from time T7 to T10 permits the gate voltage Vg to increase. Further, the gate-to-source voltage Vgs does not converge to the threshold voltage Vth as described above.

In FIG. 6H, the increment of the gate voltage Vg during the first standby period (WAT1) is denoted by reference numeral Va1. Letting the increment of the source potential Vs contributing to the increase in the gate voltage Vg through bootstrapping action via the coupling capacitance (holding capacitor Cs) be also denoted by reference numeral Va1, the source potential Vs becomes equal to "Vofs−Vx1+Va1" at the end (time T10) of the first standby period (WAT1) (refer to FIG. 8B).

Therefore, it is necessary to bring the gate potential back to the offset potential Vofs, i.e., the initialization level, and perform the threshold voltage correction again.

[Second Threshold Correction Period (VTC2)]

In the operation example of the present embodiment, therefore, the same processes as those performed during the first threshold correction period (VTC1) and first standby period (WAT1) of the previous horizontal period (1H) (time T5 to T10) are performed during the next horizontal period (1H) (time T10 to T15). That is, the second threshold correction period (VTC2) and second standby period (WAT2) are performed in the next horizontal period (1H).

However, the gate-to-source voltage Vgs (voltage held by the holding capacitor Cs) reduces to "Vx1" at time T10 when the second threshold correction period (VTC2) begins. This "Vx1" is smaller than "Vofs−VSS" which is a relatively large value assumed by the gate-to-source voltage Vgs (voltage held by the holding capacitor Cs) at time T5 when the first threshold correction period (VTC1) begins.

Figure 8C:
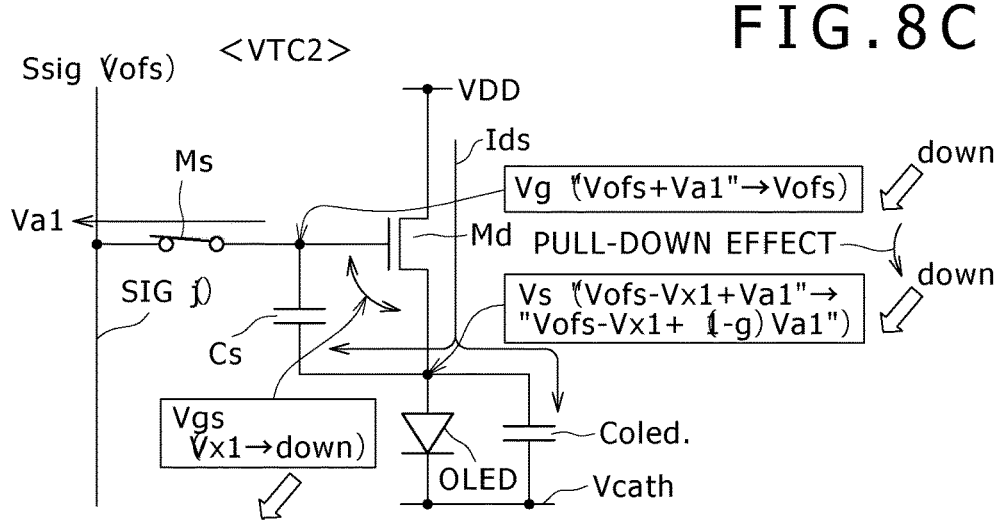

When the sampling transistor turns on at time T10 as the sampling pulse (SP2) rises as illustrated in FIG. 6B, the gate voltage Vg (=Vofs+Va1) of the drive transistor Md is connected to the signal line SIG(j) at a lower potential (Vofs). This causes a current corresponding to this difference (Va1) to flow from the gate of the drive transistor Md to the signal line SIG(j), forcing the gate voltage Vg down to the offset potential Vofs as illustrated in FIG. 8C.

The variation in potential (Va1) of the gate of the drive transistor Md is fed to the source of the same transistor Md via the holding capacitor Cs and a gate-to-source parasitic capacitance Cgs of the same transistor Md, thus pulling down the source potential Vs.

The decrement of the source potential Vs at this time is denoted by reference numeral g*Va1. Here, the capacitive coupling ratio g is expressed as g=(Cgs+Cs)/(Cgs+Cs+Coled.) where Cgs represents the gate-to-source parasitic capacitance, (Cs) the same reference numeral as the holding capacitor Cs and represents the capacitance thereof, and Coled. represents the capacitance of the organic light-emitting diode OLED. Therefore, the source potential Vs drops by "g*Va1" to "Vofs−Vx1+(1−g)Va1" from its immediately previous level or "Vofs−Vx1+Va1."

The capacitive coupling ratio g takes on a value smaller than 1, as is clear from the definition equation. Therefore, the change "g*Va1" of the source potential Vs is smaller than the change (Va1) of the gate voltage Vg.

Here, if the gate-to-source voltage Vgs (="Vx1−(1−g)Va1") of the drive transistor Md is greater than the threshold voltage Vth of the same transistor Md, the drain current Ids flows as illustrated in FIG. 8C. The drain current Ids attempts to flow until the drive transistor Md goes into cutoff as a result of the source potential Vs of the drive transistor Md becoming equal to "Vofs−Vth." In the operation example of the present embodiment, however, the sampling pulse (SP2) ends at time T12 when the gate-to-source voltage Vgs becomes equal to "Vx2" (where Vx2 is large enough to satisfy the condition Vx1>Vx2>Vth), as illustrated in FIGS. 6H and 6I. As a result, the sampling transistor Ms turns off. The voltage held by the holding capacitor Cs at time T12 is "Vx2."

[Second Standby Period (WAT2)]

The second standby period (WAT2) begins from time T12.

During the second standby period (WAT2), the sampling transistor Ms is off, causing the gate voltage Vg to electrically float, as during the previous first standby period (WAT1). As a result, as the source potential Vs rises, the gate voltage Vg will also rise (refer to FIG. 9A).

However, the effect of the increase in potential of the gate voltage Vg (bootstrapping effect) is not very large because the gate-to-source voltage Vgs at the beginning of the standby period is close to the control target "Vth." As can be seen from time T12 to T15 in FIGS. 6H and 6I, both the source potential Vs and gate voltage Vg increase only slightly.

Figure 9A:
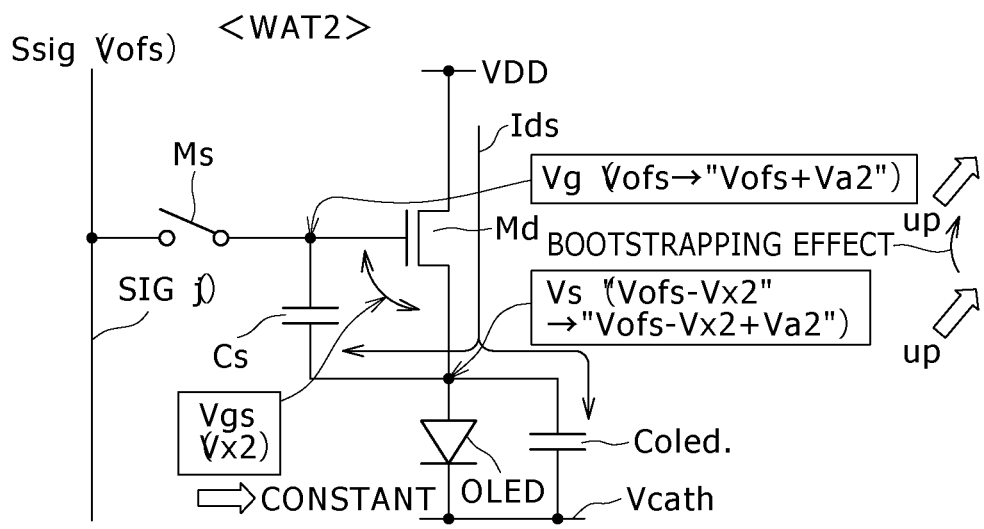
FIGS. 9A and 9B are diagrams describing the operation until a third threshold correction.
Figure 9B:
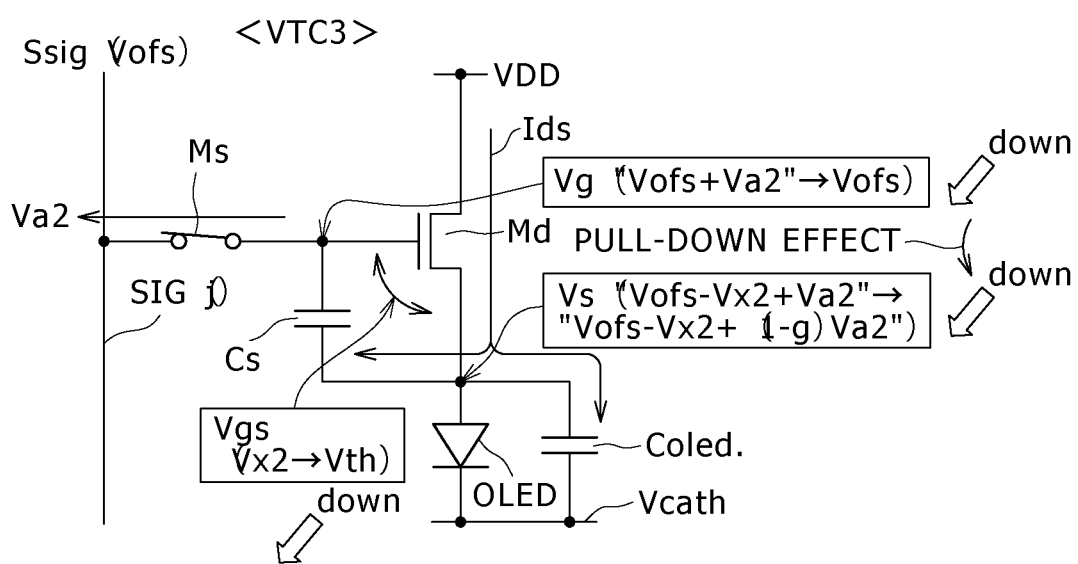

More specifically, letting the increment of the source potential Vs resulting from the flow of the drain current during the second standby period (WAT2) in FIG. 9A be denoted by reference numeral Va2, the source potential Vs becomes equal to "Vofs−Vx2+Va2" at the end of the standby period (time T15 in FIGS. 6A to 6I). This increase in the source potential by "Va2" is transferred to the gate in a floating state via the gate-to-source parasitic capacitance Cgs and holding capacitor Cs. As a result, the gate voltage Vg will also increase by the same increment or the potential Va2. It should be noted, however, that the increment "Va2" of the potential of the gate voltage Vg is far smaller than the increment "Va1" of the potential thereof during the first standby period (WAT1) as illustrated in FIG. 6H.

[Third Threshold Correction Period (VTC3)]

The "main operation" begins from time T15, initiating the third threshold correction period (VTC3).

The same processes as those performed during the second threshold correction period (VTC2) are performed during time T15 to T17 the third threshold correction period (VTC3).

However, the gate-to-source voltage Vgs (voltage held by the holding capacitor Cs) reduces to "Vx2" at time T15 when the third threshold correction period (VTC3) begins. This "Vx2" is even smaller than "Vx1" which is a relatively large value assumed by the gate-to-source voltage Vgs (voltage held by the holding capacitor Cs) at time T10 when the second threshold correction period (VTC2) begins.

The description of the basic operation will be omitted to avoid redundancy. The description of the second threshold correction period (VTC2) is applicable to the third threshold correction period (VTC3) by replacing "Va1" with "Va2" and "Vx1" with Vx2." This is also obvious from the comparison between FIG. 8C and FIG. 9B.

It should be noted that the third threshold correction period (VTC3) differs from the second one (VTC2) in that the gate-to-source voltage Vgs (voltage held by the holding capacitor Cs) becomes equal to the threshold voltage Vth by time T17 when the third threshold correction period (VTC3) ends, as illustrated in FIGS. 6H and 6I. Therefore, the drive transistor Md goes into cutoff when the gate-to-source voltage Vgs becomes equal to the threshold voltage Vth. From this moment onward, the drain current Ids will not flow. At this time, the source potential Vs of the drive transistor Md is "Vofs−Vth."

As described above, the threshold correction performed a plurality of times (three times in the present example) with a standby period provided therebetween permits the voltage held by the holding capacitor Cs to converge in a stepped manner. In the course of the convergence, the held voltage remains constant during the standby periods and eventually converges to the threshold voltage Vth.

Here, assuming that the gate-to-source voltage of the drive transistor increases by "Vin," then the same voltage is equal to "Vin+Vth." We consider two drive transistors, one having the large threshold voltage Vth and another having the small threshold voltage Vth.

The former with the large threshold voltage Vth has the large gate-to-source voltage commensurate with the large threshold voltage Vth. In contrast, the latter with the small threshold voltage Vth has the small gate-to-source voltage commensurate with the small threshold voltage Vth. Therefore, as far as the threshold voltage Vth is concerned, it is possible to pass the same amount of the drain current Ids through the drive transistor for the same data potential Vin by canceling the variation in the threshold voltage Vth using the threshold voltage correction operation.

During the three threshold correction periods, namely, the first, second and third threshold correction periods (VTC1), (VTC2) and (VTC3), it is necessary to ensure that the drain current Ids is wholly consumed for it to flow into one of the electrodes of the holding capacitor Cs, i.e., one of the electrodes of the capacitance Coled. of the organic light-emitting diode OLED, so that the same diode OLED does not turn on. If the anode voltage of the same diode OLED is denoted by reference numeral Voled., the threshold voltage thereof by reference numeral Vth_oled., and the cathode voltage thereof by reference numeral Vcath, the equation "Voled.≤Vcath+Vth_oled." must always hold in order for the same diode OLED to remain off.

Assuming here that the cathode potential Vcath of the organic light-emitting diode OLED is constant at the reference voltage VSS (e.g., ground voltage GND), the above equation can hold at all times if the threshold voltage Vth_oled. is extremely large. However, the threshold voltage Vth_oled. is determined by the manufacturing conditions of the organic light-emitting diode OLED. Further, the same voltage Vth_oled. cannot be increased excessively to achieve efficient light emission at low voltage. Therefore, the organic light-emitting diode OLED should preferably be reverse-biased by setting the cathode potential Vcath larger than the reference voltage VSS until the three threshold correction periods and the mobility correction period, which will be described below, ends.

[Third Standby Period (WAT3)]

A description has been given above of the threshold voltage correction. In the present operation example, the threshold voltage correction is followed by a standby period for the writing and mobility correction (third standby period (WAT3)). Unlike the first and second standby periods (WAT1) and (WAT2), the third standby period (WAT3) is a short period of time designed simply to prevent the erroneous sampling of the video signal Ssig at an unstable potential during the writing and mobility correction performed thereafter.

As illustrated in FIG. 6B, the third standby period (WAT3) begins at time T17 when the sampling pulse (SP3) changes from high to low level.

Figure 11A:
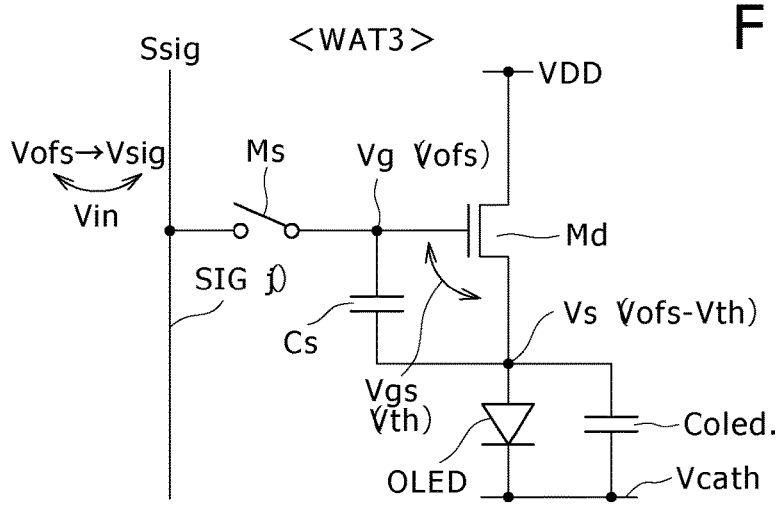
FIGS. 11A to 11C are diagrams describing the operation until a light emission period.

In the third standby period (WAT3), the video signal pulse (PPx) having the data potential Vsig to be displayed by the pixel circuit 3(1,j) as illustrated in FIG. 6A is supplied to the signal line SIG(j) as the video signal Ssig at time T18 during this period (refer to FIG. 11A). In the video signal Ssig, the difference between the data potential Vsig and offset potential Vofs corresponds to the data voltage Vin for the gray level to be displayed by the pixel circuit. That is, the data potential Vsig is equal to "Vofs+Vin."

The third standby period (WAT3) ends at time T19 when the video signal Ssig is constant at the data potential Vsig following the change in potential at time 18.

[Writing and Mobility Correction Period (W& μ)]

The writing and mobility correction period (W& μ) begins from time T19.

As illustrated in FIG. 6B, the write pulse (WP) is supplied to the gate of the sampling transistor Ms at time T19 during the application of the video signal pulse (PPx) for the main operation. This turns on the sampling transistor Ms, causing the difference between the data potential Vsig (=Vin+Vofs) of the signal line SIG(j) and the gate voltage Vg (=Vofs), i.e., the data voltage Vin, to be fed to the gate of the drive transistor Md, as illustrated in FIG. 11B. As a result, the gate voltage Vg is equal to "Vofs+Vin."

As the gate voltage Vg rises by the data voltage Vin, the source voltage Vs will also rise. At this time, the data voltage Vin is not transferred "as-is" to the source potential Vs. Instead, the source potential Vs will rise only by the change of the data voltage Vin proportional to the capacitive coupling ratio g, i.e., "g*Vin." Therefore, the source potential Vs after the change is equal to "Vofs−Vth+g*Vin." As a result, the gate-to-source voltage Vgs of the drive transistor Md is equal to "(1−g)Vin+Vth."

Here, a description will be given of the variation due to the mobility μ.

In the three threshold voltage corrections performed up to this point, the drain current Ids contains, in fact, an error resulting from the mobility μ each time this current flows. However, the error caused by the mobility μ was not treated as problematic because the variation in the threshold voltage Vth was large. At this time, the description was given by writing the voltages simply as "Va1" and "Va2" to represent the results rather than using the capacitive coupling ratio g. This was done to avoid complication associated with describing the variation in the mobility.

As already explained, on the other hand, the threshold voltage Vth is held by the holding capacitor Cs after a threshold voltage correction performed in a strict manner. If the drive transistor Md is turned on thereafter, the drain current Ids will remain unchanged irrespective of the magnitude of the threshold voltage Vth. Therefore, assuming that the voltage held by the holding capacitor Cs (gate-to-source voltage Vgs) changes due to the drive current Id at the time of the conduction of the drive transistor Md after the threshold voltage correction, this change ΔV (positive or negative) reflects not only the variation in the mobility μ of the drive transistor Md, and more precisely, the mobility which, in a strict sense, is a physical parameter of the semiconductor material, but also the comprehensive variation in those factors affecting the current driving capability in terms of transistor structure or manufacturing process.

Figure 11B:
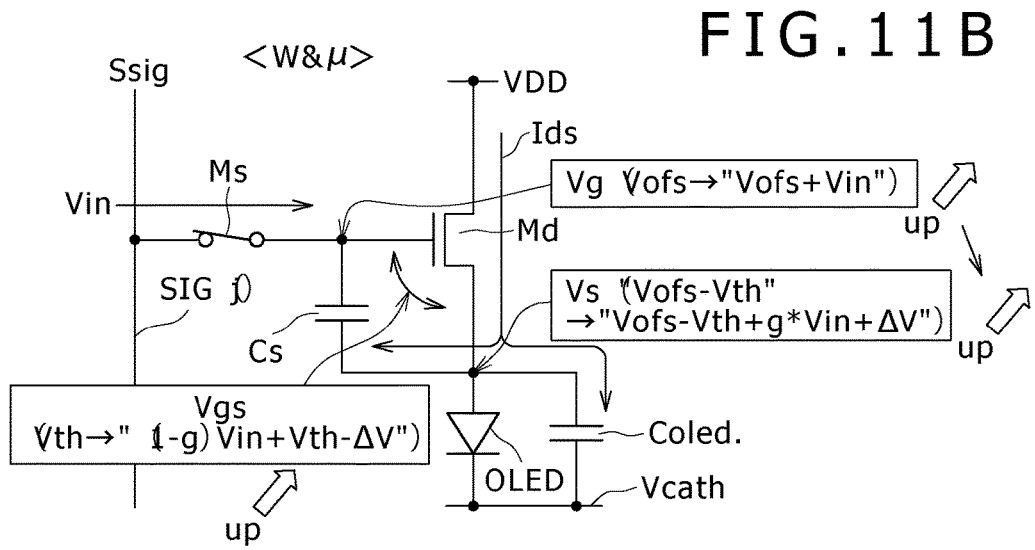
Figure 11C:
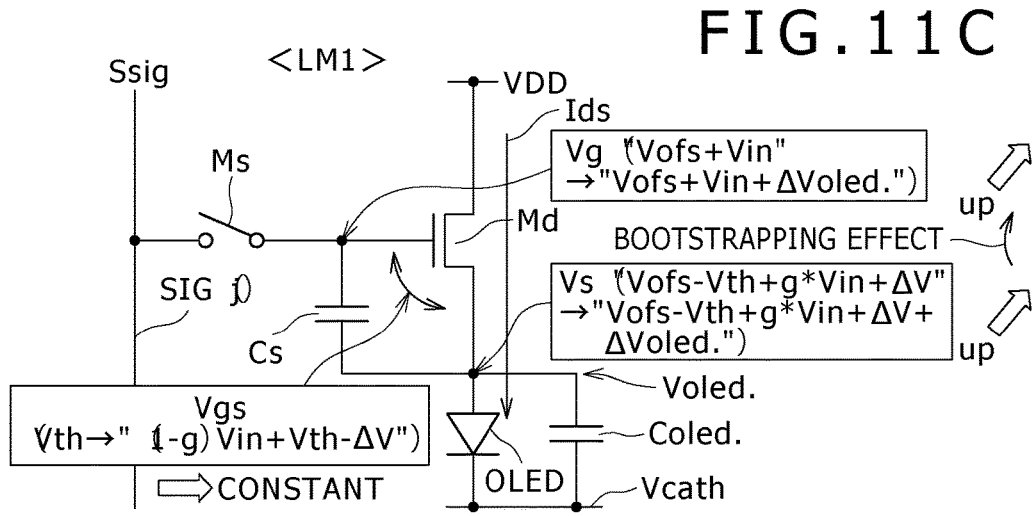

Going back to the description of the operation in consideration of the above, when the data voltage Vin is added to the gate potential Vg after the sampling transistor Ms has turned on in FIG. 11B, the drive transistor Md attempts to pass the drain current Ids, commensurate in magnitude with the data voltage Vin (gray level), between the drain and source. At this time, the drain current Ids varies according to the mobility μ. As a result, the source potential Vs is given by "Vofs−Vth+g*Vin+ΔV," which is the sum of "Vofs−Vth+g*Vin" and the change ΔV resulting from the mobility μ.

At this time, in order for the organic light-emitting diode OLED not to emit light, it is only necessary to set the cathode potential Vcath in advance according, for example, to the data voltage Vin and capacitive coupling ratio g so that the equation Vs(=Vofs−Vth +g*Vin+ΔV)<Vth_oled.+Vcath is satisfied.

Setting the cathode potential Vcath in advance as described above reverse-biases the organic light-emitting diode OLED, bringing the same diode OLED into a high impedance state. As a result, the organic light-emitting diode OLED does not emit light and exhibits a simple capacitive characteristic rather than a diode characteristic.

At this time, so long as the above equation is satisfied, the source potential Vs will not exceed the sum of the threshold voltage Vth_oled. and cathode potential Vcath of the organic light-emitting diode OLED. Therefore, the drain current Ids (drive current Id) is used to charge a combined capacitance C=Cs+Coled.+Cgs which is the sum of three capacitance values. These are the capacitance of the holding capacitor Cs (denoted by the same reference numeral Cs), that of the equivalent capacitance of the organic light-emitting diode OLED (denoted by the same reference numeral Coled. as the parasitic capacitance) when the same diode OLED is reverse-biased and that of a parasitic capacitance (denoted by Cgs) existing between the gate and source of the drive transistor Md. This causes the source potential Vs of the drive transistor Md to rise. At this time, the threshold voltage correction operation of the drive transistor Md is already complete. Therefore, the drain current Ids flowing through the same transistor Md reflects the mobility μ.

As shown in the equation (1−g)Vin+Vth−ΔV in FIGS. 6H and 6I, as far as the gate-to-source voltage Vgs held by the holding capacitor Cs is concerned, the change ΔV added to the source potential Vs is subtracted from the gate-to-source voltage Vgs (=(1−g)Vin+Vth) after the threshold voltage correction. Therefore, the change ΔV is held by the holding capacitor Cs so that a negative feedback is applied. As a result, the change ΔV will also be hereinafter referred to as a "negative feedback amount."

The negative feedback amount ΔV can be expressed by the approximation equation ΔV=t*Ids/Coled. because the equation Coled.>>Cs+Cgs holds when the organic light-emitting diode OLED is reverse-biased. It is clear from this approximation equation that the change ΔV is a parameter which changes in proportion to the change of the drain current Ids.

From the approximation equation of the feedback amount ΔV, the same amount ΔV added to the source potential Vs is dependent upon the magnitude of the drain current Ids (this magnitude has a positive correlation with the magnitude of the data voltage Vin, i.e., the gray level) and the period of time during which the drain current Ids flows, i.e., time (t) from time T19 to time T20 demanded for the mobility correction shown in FIG. 6B. That is, the larger the gray level and the longer the time (t), the larger the negative feedback amount ΔV.

Therefore, the mobility correction time (t) need not always be constant. Rather, it may be more appropriate to adjust the mobility correction time (t) according to the drain current Ids (gray level). For example, when the gray level is almost white with the drain current Ids being large, the mobility correction time (t) should be short. In contrast, when the gray level is almost black with the drain current Ids being small, the mobility correction time (t) should be long. This automatic adjustment of the mobility correction time according to the gray level can be implemented by providing this functionality, for example, in the write signal scan circuit 42 in advance.

[Light Emission Period (LM1)]

The writing and mobility correction period (W& μ) ends at time T20, initiating the light emission period (LM1).

The write pulse (WP) ends at time T20, turning off the sampling transistor Ms and causing the gate of the drive transistor Md to electrically float.

Incidentally, in the writing and mobility correction period (W& μ) prior to the light emission period (LM1), the drive transistor Md may not always be able to pass the drain current Ids commensurate with the data voltage Vin despite its attempt to do so. The reason for this is as follows. That is, the gate voltage Vg of the drive transistor Md is fixed at Vofs+Vin if the current level (Id) flowing through the organic light-emitting diode OLED is considerably smaller than that (Ids) flowing through the drive transistor Md because the sampling transistor Ms is on. The source potential Vs attempts to converge to the potential (Vofs+Vin−Vth)

which is lower by the threshold voltage Vth from Vofs+Vin. Therefore, no matter how long the mobility correction time (t) is extended, the source potential Vs will not exceed the above convergence point. The mobility should be corrected by monitoring the difference in the mobility μ based on the difference in time demanded for the convergence. Therefore, even if the data voltage Vin close to white that has the maximum brightness is supplied, the end point of the mobility correction time (t) is determined before the convergence is achieved.

When the gate of the drive transistor Md floats after the light emission period (LM1) has begun, the source potential Vs of the same transistor Md is allowed to rise further. Therefore, the drive transistor Md acts to pass the drive current Id commensurate with the supplied data voltage Vin.

This causes the source potential Vs (anode potential of the organic light-emitting diode OLED) to rise. After a while, the organic light-emitting diode OLED is no longer reverse-biased. As a result, the drain current Ids begins to flow through the same diode OLED as the drive current Id as illustrated in FIG. 11C, causing the same diode OLED to emit light. Shortly after the light emission begins, the drive transistor Md is saturated with the drain current Ids commensurate with the supplied data voltage Vin. When the same current Ids (=Id) is brought to a constant level, the organic light-emitting diode OLED will emit light at the brightness commensurate with the data voltage Vin.

The increase in the anode potential of the organic light-emitting diode OLED taking place from the beginning of the light emission period (LM1) to when the brightness is brought to a constant level is none other than the increase in the source potential Vs of the drive transistor Md. This increase in the source potential Vs will be denoted by reference numeral ΔVoled. to represent the increment of the anode voltage Voled. of the organic light-emitting diode OLED. The source potential Vs of the drive transistor Md becomes equal to "Vofs−Vth+g*Vin+ΔV+ΔVoled (refer to FIG. 6I).

On the other hand, the gate potential Vg increases by the increment ΔVoled. as does the source potential Vs as illustrated in FIG. 6H because the gate is floating. As the drain current Ids saturates, the source potential Vs will also saturate, causing the gate potential Vg to saturate.

As a result, the gate-to-source voltage Vgs (voltage held by the holding capacitor Cs) is maintained at the level during the mobility correction ("(1−g) Vin+Vth−ΔV") throughout the light emission period (LM1).

During the light emission period (LM1), the drive transistor Md functions as a constant current source. As a result, the I-V characteristic of the organic light-emitting diode OLED may change over time, changing the source potential Vs of the drive transistor Md.

However, the voltage held by the holding capacitor Cs is maintained at (1−g)Vin+Vth−ΔV, irrespective of whether the I-V characteristic of the organic light-emitting diode OLED changes over time. The voltage held by the holding capacitor Cs contains two components, (+Vth) adapted to correct the threshold voltage Vth of the drive transistor Md and (−ΔV) adapted to correct the variation due to the mobility μ. Therefore, even if there is a variation in the threshold voltage Vth or mobility μ between different pixels, the drain current Ids of the drive transistor Md, i.e., the drive current Id of the organic light-emitting diode OLED, will remain constant.

More specifically, the larger the threshold voltage Vth, the more the drive transistor Md reduces the source potential Vs using the threshold voltage correction component (+Vth) contained in the held voltage, thus increasing the source-to-drain voltage so that the drain current Ids (drive current Id) flows in a larger amount. Therefore, the drain current Ids remains constant even in the event of a change in the threshold voltage Vth.

On the other hand, if the change ΔV is small because of the small mobility μ, the voltage held by the holding capacitor Cs will decline only to a small extent thanks to the mobility correction component (−ΔV) contained therein. This provides a relatively large source-to-drain voltage. As a result, the drive transistor Md operates in such a manner as to pass the drain current Ids (drive current Id) in a larger amount. Therefore, the drain current Ids remains constant even in the event of a change in the mobility μ.

As described above, the light emission brightness of the organic light-emitting diode OLED is maintained constant so long as the data voltage Vin is the same even in the event of a variation in the threshold voltage Vth or mobility μ between different pixels, and further irrespective of the change in I-V characteristic of the organic light-emitting diode OLED over time.

<Examples of Planar and Sectional Structure>

Based on the above block and circuit configurations, a description will be given next of the planar pattern and sectional structure of the pixel circuit with reference to the accompanying drawings.

Figure 12A:
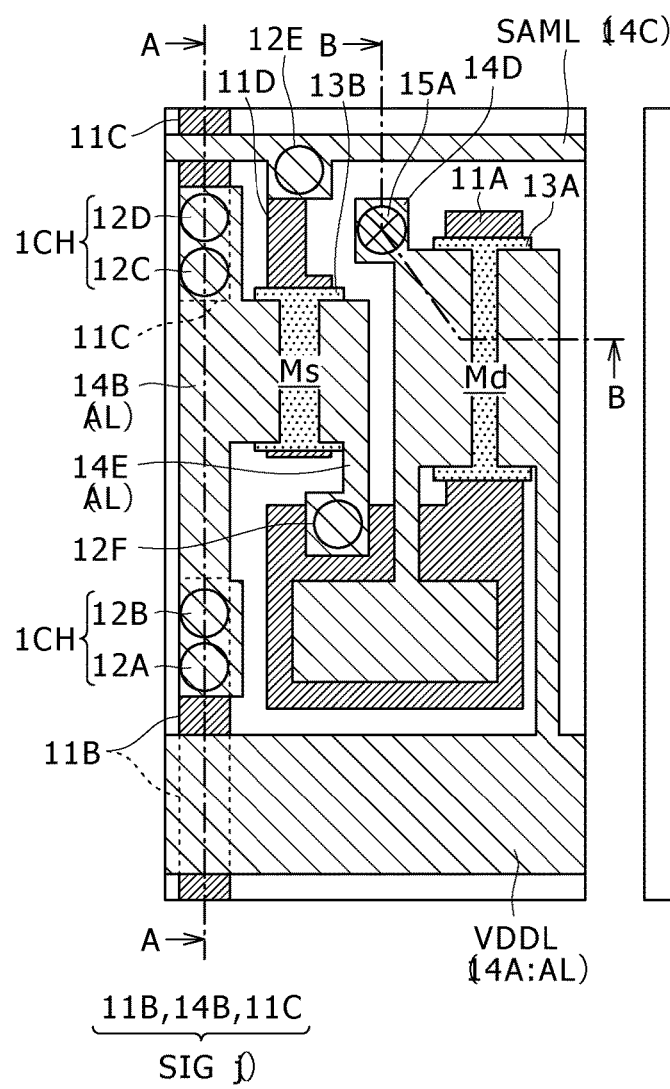
FIGS. 12A and 12B are plan views of a pixel circuit according to the embodiment of the present invention.
Figure 12B:
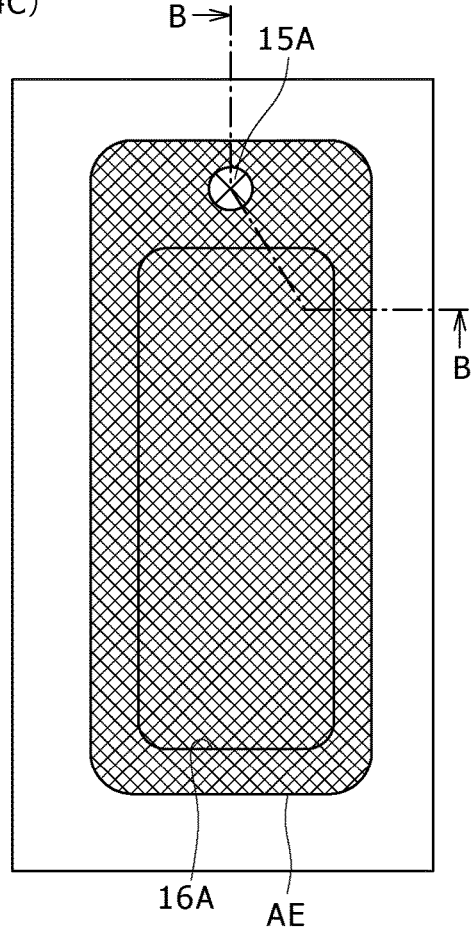

FIGS. 12A and 12B illustrate a planar pattern of the pixel circuit 3(i,j) in the ith row and jth column. FIG. 12B is a plan view with the cathode electrode on the uppermost layer (formed over the entire surface) omitted. FIG. 12A is a plan view midway during the manufacture with the electrodes and organic multi-layered film of the organic light-emitting diode OLED including the cathode electrode on the uppermost layer (formed over the entire surface) omitted.

Figure 13A:
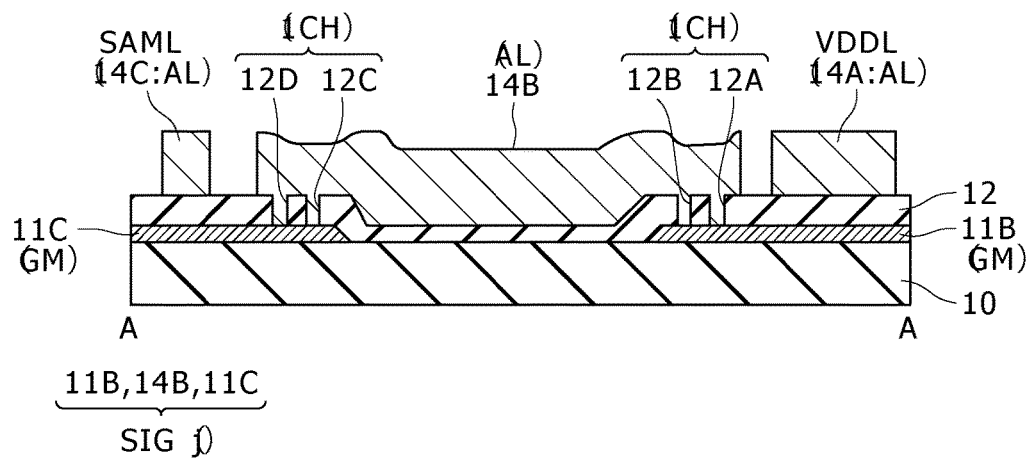
FIGS. 13A and 13B are sectional views of the pixel circuit according to the embodiment of the present invention.
Figure 13B:
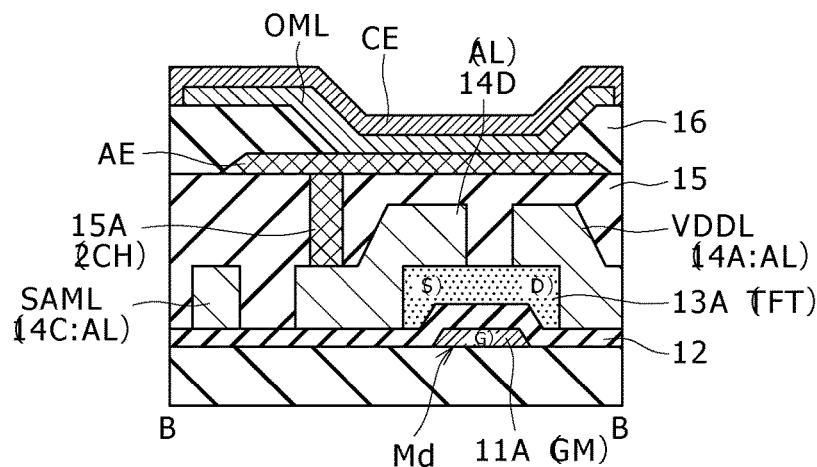

FIG. 13A is a schematic sectional view taken on line A-A in FIG. 12A. FIG. 13B is a schematic sectional view taken on line B-B in FIGS. 12A and 12B.

In FIGS. 13A and 13B, an underlying layer 10 (type of insulating layer) is formed directly on an unshown substrate made, for example, of glass or indirectly via other film.

In the sectional view shown in FIG. 13B, a gate electrode 11A is formed on the underlying layer 10. The gate electrode 11A includes a given gate metal layer (GM) and contains a high-fusion-point metal such as molybdenum (Mo). The sectional view in FIG. 13B shows where the drive transistor Md illustrated, for example, in FIG. 5 is formed. As illustrated in FIG. 12A, a gate electrode 11D, slightly different in size from the gate electrode 11A, is similarly formed where the sampling transistor Ms is formed.

In the sectional view shown in FIG. 13A, on the other hand, two layers are formed on the underlying layer 10, namely, first and second layers (patterns) which include the gate metal layer (GM) provided at the same hierarchical level and made of the same material as the gate electrode 11A and which contain a high-fusion-point metal wiring (hereinafter referred simply to as the first and second high-fusion-point metal wiring layers). The first high-fusion-point metal wiring layer (pattern) 11B and second high-fusion-point metal wiring layer (pattern) 11C are spaced apart within the pixel but continuous between the adjacent pixels, as illustrated in FIG. 12A. That is, the first high-fusion-point metal wiring layer 11B shown in FIG. 12A is connected to the second high-fusion-point metal wiring layer 11C (not shown) in the other unshown pixel which is continuous as a pattern on one side in the column direction (downward from FIG. 12A). Similarly, the second high-fusion-point metal wiring layer 11C shown in FIG. 12A is connected to the first high-fusion-point metal wiring layer 11B (not shown) in the other unshown pixel which is continuous as a pattern on the other side in the column direction (upward from FIG. 12A).

A gate insulating film 12 is formed over the entire surface of the underlying layer 10 to cover the surfaces of the gate electrode 11A (FIG. 13B) and the first and second high-fusion-point metal wiring layers 11B and 11C (FIG. 13A).

In the sectional view shown in FIG. 13B, a TFT layer 13A of the drive transistor Md is formed on the gate insulating film 12. The TFT layer 13A is made, for example, of amorphous silicon (or polysilicon for P-channel TFT). As illustrated in FIG. 12A, a TFT layer 13B of the sampling transistor Ms is formed similarly although different in size from the TFT layer 13A. The TFT layer 13A shown in FIG. 13B is doped with an impurity of opposite conductivity type, thus forming source (S) and drain (D) regions which are separated from each other. The same holds true for the TFT layer 13B.

In the sectional view shown in FIG. 13A, a plurality of contact holes or contact holes 12A and 12B are formed on the end portion of the first high-fusion-point metal wiring layer 11B in the gate insulating film 12. Similarly, a plurality of contact holes or contact holes 12C and 12D are formed on the end portion of the second high-fusion-point metal wiring layer 11C in the gate insulating film 12.

A total of the four contact holes 12A to 12D or two holes for each of the wiring connection sections serve as first contact holes (1CH) adapted to connect together the high-fusion-point metal wiring layer and its overlying layer.

More specifically, the first high-fusion-point metal wiring layer 11B has its end portion connected to one of the end portions of an overlying wiring layer 14B via the contact holes 12A and 12B. The overlying wiring layer (pattern) 14B is provided on the gate insulating film 12 and made, for example, of aluminum (AL). Further, the second high-fusion-point metal wiring layer 11C has its end portion connected to the other end portion of the overlying wiring layer 14B provided on the gate insulating film 12 via the contact holes 12C and 12D.

A supply line of the source voltage VDD (hereinafter referred to as the source voltage supply line VDDL) is provided above the first high-fusion-point metal wiring layer 11B. The source voltage supply line VDDL is insulated from the same layer 11B via the gate insulating film 12 and separated from the overlying wiring layer 14B by a pattern. The same line VDDL is connected to the horizontal pixel line drive circuit 41 shown in FIG. 5 and is designed to alternately apply the source voltage VDD and reference voltage VSS to the drain of the drive transistor Md. Therefore, a branch (denoted by the same reference numeral VDDL) of the source voltage supply line VDDL is in low-resistance electrical contact with the region which will serve as the drain (D) of the TFT layer 13A. On the other hand, an upper electrode layer (pattern) 14D of the holding capacitor Cs is in electrical contact with the region which will serve as the source (S) of the drive transistor Md. The upper electrode layer 14D is provided at the same hierarchical level and made of the same material (aluminum AL) as the source voltage supply line VDDL. As illustrated in FIG. 12A, the same layer 14D overlaps the lower electrode layer of the holding capacitor Cs which is continuous from the gate electrode 11A. This portion forms the holding capacitor Cs having a MIS (Metal-Insulator-Semiconductor) structure.

In FIG. 13B, a control line SAML of the sampling transistor Ms is provided above the second high-fusion-point metal wiring layer 11C. The control line SAML is insulated from the same layer 11C via the gate insulating film 12 and separated from the overlying wiring layer 14B by a pattern. The same line SAML is connected to the write signal scan circuit 42 shown in FIG. 5 and is designed to apply the write drive pulse WS(i) to the gate of the sampling transistor Ms. As illustrated in FIG. 12A, therefore, the control line SAML is connected to the gate electrode 11D of the sampling transistor Ms in the underlying layer via a contact hole 12E which is one of the first contact holes (1CH).

The control line SAML is disposed long in the row direction in parallel with the source voltage supply line VDDL. The signal line SIG(j) has a structure in which the second high-fusion-point metal wiring layer 11C serves as a lower bridge at the intersection with the control line SAML (referred to as the lower bridge structure in the present specification). Similarly, the signal line SIG(j) has a structure in which the first high-fusion-point metal wiring layer 11B serves as a lower bridge at the intersection with the source voltage supply line VDDL (lower bridge structure).

It should be noted that the overlying wiring layer 14B is connected, on the pattern, to the drain side of the TFT layer 13B of the sampling transistor Ms and that an in-cell wiring 14E, made of aluminum (AL) and making up part of the control node NDc of the drive transistor Md shown in FIG. 5, is connected to the source side thereof. The in-cell wiring 14E is electrically connected to the lower electrode layer of the holding capacitor Cs in the underlying layer via a contact hole 12F which is one of the first contact holes (1CH).

A planarizing film 15 is formed over the entire surface to bury the aluminum (AL) wirings formed as described above, i.e., the source voltage supply line VDDL, control line SAML, overlying wiring layer 14B and upper electrode layer 14D, and planarize the surface by removing the level differences therebetween (refer to FIG. 13B).

As shown in the sectional view in FIG. 13B, an anode contact 15A is formed in a portion of the planarizing film 15 on the upper electrode layer 14D by filling a second contact hole (2CH), formed in the planarizing film 15, with a conductive material.

Then, an anode electrode (AE), a protective film 16, an organic multi-layered film (OML) and a cathode electrode (CE) are deposited in this order, thus forming the organic light-emitting diode OLED. The anode electrode (AE) is formed on the planarizing film 15 and in contact with the end surface of the anode contact 15A. The protective film 16 is formed on the anode electrode (AE) and has an opening portion 16A one size smaller than the anode contact 15A. The organic multi-layered film (OML) covers the protective film 16. The cathode electrode (CE) is formed in the form of a blanket over the entire surface of the area occupied by the pixel. As illustrated in FIG. 12B, the protective film 16 having the opening portion 16A one size smaller than the anode electrode (AE) is formed on the cathode electrode (CE).

In the signal line SIG(j) having the pattern and sectional structure as described above, a plurality of contact holes such as the contact holes 12A to 12D are formed for each wiring connection section. That is, the contact holes 12A and 12B are formed for the wiring connection section between the first high-fusion-point metal wiring layer 11B and overlying wiring layer 14B forming the lower bridge structure. The contact holes 12C and 12D are formed for the wiring connection section between the second high-fusion-point metal wiring layer 11C and overlying wiring layer 14B forming the lower bridge structure. This provides a smaller delay of the video signal Ssig supplied from the H scanner 5 shown in FIG. 5 to the signal line SIG(j) than connection by a single contact hole.

Further, the control line SAML is the single layer wiring 14C made of low-resistance aluminum (AL) and has no contacts midway along the wiring. This provides a smaller delay of the write drive pulse WS(i) supplied from the write signal scan circuit 42 shown in FIG. 5 to the control line SAML than if the control line SAML were wholly or partly formed with the gate metal (GM).

In designing the sampling timing of the data potential Vsig using the sampling transistor Ms, therefore, the delays of the two signals are reduced. This provides a wider sampling margin for the variation in level of the data potential Vsig, thus ensuring greater resistance to display quality degradation. In other words, the present embodiment is advantageous in that the wider sampling margin provides greater leeway for achieving larger screen size and higher definition (improved drive frequency).

Any number of contact holes may be provided for each wiring connection section so long as there are at least two holes. It should be noted, however, that this number should preferably be greater than the maximum number of contact holes provided for each of the other connection sections in the pixel including the connection section adapted to connect the control line SAML to the control node (gate) of the sampling transistor Ms. That is, in the case of the example shown in FIGS. 13A and 13B, there is one contact provided for each "connection section," namely, the contact hole 12E, contact hole 12F and anode contact 15A. In contrast, there are two contacts provided for each wiring connection section, namely, a pair of the contact holes 12A and 12B and a pair of the contact holes 12C and 12D.

When the number of the contact holes is increased for each of the wiring connection sections, only a given number of the contact holes are provided if the waveform of the pulse of the video signal Ssig having its active level at the data potential Vsig no longer shows any change in potential with the given number of the contact holes or more provided. More specifically, in the above example, there are two contact holes for each of the wiring connection sections, namely, a pair of the contact holes 12A and 12B and a pair of the contact holes 12C and 12D. Now, we assume that this number is increased to 3, 4 and so on. When the number of contact holes is increased, the video signal pulse (PP) or (PPx) of the video signal Ssig may be regarded as showing substantially no change in waveform with a given number of the contact holes or more provided. The term "showing substantially no change in waveform" may be defined arbitrarily. For example, however, assuming that the pulse is monitored when it is 90% of its peak value, and if this monitored change point of the waveform falls within a given tolerance in all the pixels in the intended row of the pixel array 2, the signal may be regarded as "showing substantially no change in waveform." If the fact that there is substantially no change in waveform is detected, it is only necessary to estimate the minimum number of contacts at the time of detection and determine this minimum number (2 or more) as the number of contacts per wiring connection section.

Figure 14:
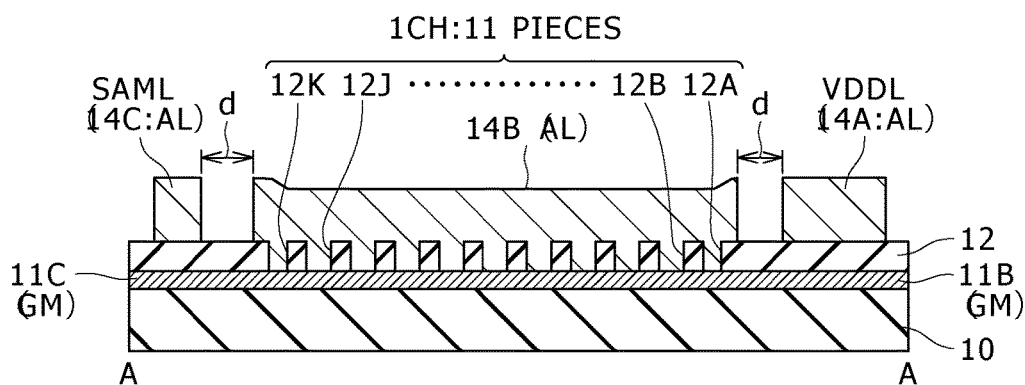
FIG. 14 is a sectional view of the pixel circuit according to a modification example of the embodiment of the present invention.

Still further, as illustrated in the sectional view of FIG. 14 taken along line A-A in FIG. 12A as with that of FIG. 13A, the first and second high-fusion-point metal wiring layers 11B and 11C are formed to be connected together on the pattern of the gate metal layer (GM). Then, the overlying wiring layer 14B is formed to the maximum length with a necessary spacing width 'd' provided on both ends. Prior to this formation, as many first contacts (1CH) as can be disposed along the maximum length of the overlying wiring layer 14B or 11 contact holes 12A to 12K in this case are formed in advance in the gate insulating film 12.

In such a structure, even if a high-resistance state arises as a result of the aluminum coming close to breaking for unknown reason, there is a path connection near the high resistance portion via the portion of the high-fusion-point metal wiring layer in the underlying layer. Therefore, even if the aluminum (AL) increases in resistance, a repair route for the wiring path will be formed to ensure that the wiring resistance does not increase to the extent possible because the aluminum is short although high in resistance. This provides a wiring structure unsusceptible to the increased resistance. It should be noted that this structure is more preferred for its smaller wiring resistance than that shown in FIG. 13A even in the absence of any break.

The increased resistance of the signal line SIG(j) is likely to lead to serious display defects in the form of line defects rather than point defects. However, the above embodiment is significantly advantageous in that it can prevent display quality degradation by preventing line defects.

The present application contains subject matter related to that disclosed in Japanese priority Patent Application JP 2008-126118 filed in the Japan Patent Office on May 13, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. An apparatus comprising:
a plurality of pixels arranged in a matrix form, each of the pixels including a capacitor, a first transistor, a second transistor, and a light emitting element;
a plurality of first lines that extend along a first direction and connected to the pixels;
a plurality of second line that extend along a second direction and connected to the pixels, the second direction being perpendicular to the first direction;
wherein,
(a) each of the first lines includes a first lower wiring portion, a second lower wiring portion, and an upper wiring portion, and
(b) in each of the first lines:
(i) the upper wiring portion is connected to the first lower wiring portion via a first plurality of contact holes formed in an insulating film, and connected to the second lower wiring portion via a second plurality of contact holes formed in the insulating film,
(ii) the upper wiring portion is on the insulating film,
(iii) the insulating film is on the lower wiring portion,
(iv) the power supply line crosses the first lower wiring portion, and
(v) the second lower wiring portion crosses a corresponding one of the second lines.

* * * * *